United States Patent
Yamanaka

(10) Patent No.: US 11,869,435 B2
(45) Date of Patent: Jan. 9, 2024

(54) DISPLAY DEVICE AND PROXIMITY SENSOR CONTROL METHOD

(71) Applicant: Sharp Kabushiki Kaisha, Osaka (JP)

(72) Inventor: Shigetsugu Yamanaka, Sakai (JP)

(73) Assignee: SHAR KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/920,425

(22) PCT Filed: May 25, 2020

(86) PCT No.: PCT/JP2020/020465
§ 371 (c)(1),
(2) Date: Mar. 7, 2023

(87) PCT Pub. No.: WO2021/240573
PCT Pub. Date: Dec. 2, 2021

(65) Prior Publication Data
US 2023/0298520 A1 Sep. 21, 2023

(51) Int. Cl.
*G09G 3/3233* (2016.01)

(52) U.S. Cl.
CPC ... *G09G 3/3233* (2013.01); *G09G 2300/0819* (2013.01); *G09G 2300/0842* (2013.01); *G09G 2300/0861* (2013.01); *G09G 2310/0202* (2013.01); *G09G 2310/08* (2013.01); *G09G 2320/046* (2013.01); *G09G 2360/14* (2013.01)

(58) Field of Classification Search
CPC ......... G09G 3/3233; G09G 2300/0819; G09G 2300/0842; G09G 2300/0861; G09G 2310/0202; G09G 2310/08; G09G 2310/046; G09G 2360/14
See application file for complete search history.

(56) References Cited

U.S. PATENT DOCUMENTS

| | | | |
|---|---|---|---|
| 2018/0061315 A1 | 3/2018 | Kim et al. | |
| 2019/0259335 A1* | 8/2019 | Yang | G09G 3/3225 |
| 2019/0259338 A1* | 8/2019 | Li | G09G 3/3266 |
| 2019/0259344 A1* | 8/2019 | Shi | G09G 3/20 |
| 2019/0259783 A1* | 8/2019 | Baek | H10K 71/00 |

(Continued)

FOREIGN PATENT DOCUMENTS

JP  2018-032033 A  3/2018

OTHER PUBLICATIONS

Official Communication issued in International Patent Application No. PCT/JP2020/020465, dated Aug. 25, 2020.

*Primary Examiner* — Sejoon Ahn
(74) *Attorney, Agent, or Firm* — Keating & Bennett, LLP

(57) ABSTRACT

In an organic EL display device including a proximity sensor, deterioration in display quality due to irradiation with IR light is suppressed. In a display period during which an image is displayed on a display unit, an emitting unit of the proximity sensor emits the IR light only in a period including a part of an IR light irradiation region turn-off period during which a plurality of light-emission control lines are driven such that no current is supplied to each of organic EL elements included in pixel circuits in a row corresponding to the IR light irradiation region, the period being before a time point at which the writing of a data signal into each of the pixel circuits in each of rows corresponding to the IR light irradiation region is started.

16 Claims, 21 Drawing Sheets

(56) References Cited

U.S. PATENT DOCUMENTS

2019/0267573 A1\* 8/2019 Lee .................... H10K 59/1213
2019/0287463 A1 9/2019 Zhang et al.
2020/0286435 A1\* 9/2020 Feng ........................ G09G 3/20

\* cited by examiner

Fig.12

|  | W255 | | W000 | | PULSE AREA | |
|---|---|---|---|---|---|---|
|  | PEAK LUMINANCE (cd/m²) | WIDTH (ms) | PEAK LUMINANCE | WIDTH (ms) | W255 | W000 |
| EMISSION-ON | 2500 | 16.67 | 10 | 16.67 | 41675 | 166.7 |
| EMISSION-OFF | 0.018 | 1.9 | 0.018 | 1.9 | 0.0171 | 0.0475 |
| EMISSION-ON/EMISSION-OFF | 138889 | 8.8 | 200 | 8.8 | 2437135 | 3509 |

811

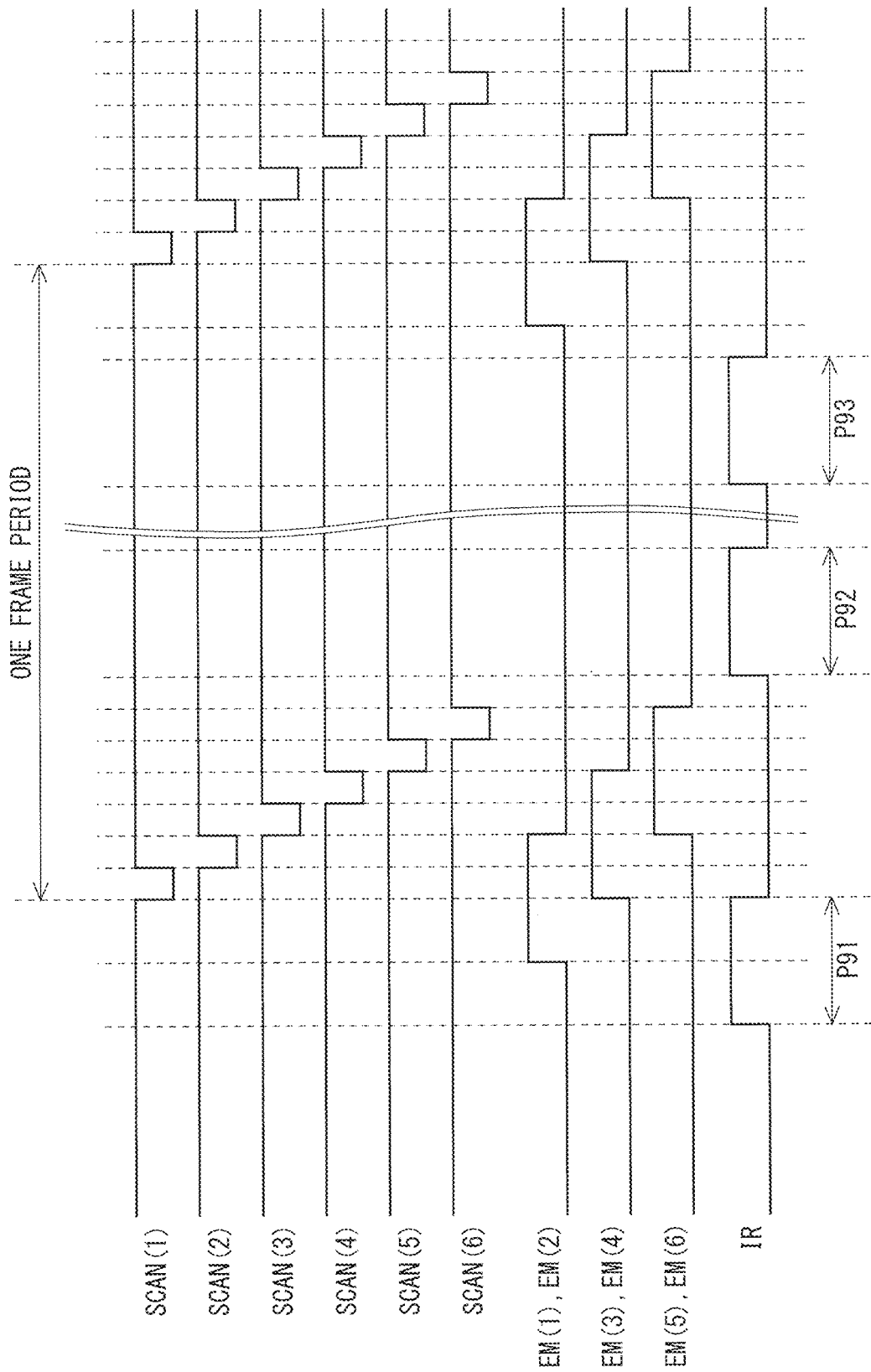

DISPLAY DEVICE AND PROXIMITY SENSOR CONTROL METHOD

TECHNICAL FIELD

The following disclosure relates to a display device provided with a proximity sensor, and a control method for a proximity sensor mounted on the display device.

BACKGROUND ART

In recent years, an organic electroluminescent (EL) display device provided with a pixel circuit including an organic EL element has been put into practical use. The organic EL element is also called an organic light-emitting diode (OLED) and is a self-luminous display element that emits light with luminance corresponding to a current flowing therethrough. With the organic EL element being a self-luminous display element as described above, the organic EL display device can be easily reduced in thickness and power consumption and increased in luminance as compared to a liquid crystal display device that requires a backlight, a color filter, and the like.

Regarding the organic EL display device as described above, in recent years, the mounting of a proximity sensor that detects the presence or absence of an object at a close position has progressed. The proximity sensor mounted on the organic EL display device typically includes an emitting unit that emits infrared light (IR light) from the back surface of a display unit, and a light receiving unit that receives reflected light of the IR light. The presence or absence of an object at a close position is determined on the basis of the magnitude of a current generated in accordance with the amount of reflected light received by the light receiving unit. An invention of an organic EL display device including such a proximity sensor is disclosed in, for example, Japanese Laid-Open Patent Publication No. 2018-32033. In the organic EL display device disclosed in Japanese Laid-Open Patent Publication No. 2018-32033, a pixel corresponding to the position of an IR light source is set to a non-light emission state throughout a period during which the IR light source is being driven.

PRIOR ART DOCUMENT

Patent Documents

[Patent Document 1] Japanese Laid-Open Patent Publication No. 2018-32033

SUMMARY

Problems to be Solved by the Invention

However, regarding the organic EL display device provided with the proximity sensor, deterioration in display quality has become a problem. This will be described below, focusing on a case where a pixel circuit (a pixel circuit including one organic EL element 61, seven transistors T1 to T7 (first initialization transistor T1, threshold voltage compensation transistor T2, write control transistor T3, drive transistor T4, power supply control transistor T5, light-emission control transistor T6, second initialization transistor T7), and one holding capacitor Ca) 60 as illustrated in FIG. 6 is used.

In the present specification, for convenience, a state in which a data signal is being written into the pixel circuit 60 (a state in which the threshold voltage compensation transistor T2 and the write control transistor T3 are on) is referred to as "scan-on", and a state in which a data signal (display data) is not being written into the pixel circuit 60 (a state in which the threshold voltage compensation transistor T2 and the write control transistor T3 are off) is referred to as "scan-off". Further, for convenience, a state in which a drive current is being supplied to the organic EL element 61 (a state in which the power supply control transistor T5 and the light-emission control transistor T6 are on) is referred to as "emission-on", and a state in which the drive current is not being supplied to the organic EL element 61 (a state in which the power supply control transistor T5 and the light-emission control transistor T6 are off) is referred to as "emission-off". A region that is irradiated with the IR light emitted from the emitting unit of the proximity sensor in the entire display unit is referred to as an "IR light irradiation region (infrared light irradiation region)".

Hereinafter, attention is focused on the pixel circuit in the IR light irradiation region. When the IR light irradiation is being performed, the on-currents and the off-currents of all the transistors T1 to T7 increase as compared with when the IR light irradiation is not being performed. In this regard, an influence on the display and the like varies depending on the IR light irradiation timing.

First, a description will be given of an influence on display or the like when the IR light irradiation is performed at the time of scan-off. In this case, as the off-currents of the first initialization transistor T1 and the threshold voltage compensation transistor T2 increase, the potential of a control node NG changes (a voltage between both ends of the holding capacitor Ca changes). Specifically, the potential of the control node NG decreases. Thereby, in the emission-on-state, the drive current passing through the power supply control transistor T5, the drive transistor T4, and the light-emission control transistor T6 relatively increases, and the characteristic of the drive transistor T4 changes. FIG. 20 is a diagram for explaining an example of a change in a current-voltage characteristic when a thin-film transistor is irradiated with IR light. FIG. 20 illustrates characteristics when LIPS-TFT (a thin-film transistor using low-temperature polysilicon for a channel layer) for testing is used in a saturation region with a drain-source voltage Vds set to −10 V. A solid line 901 indicates a characteristic in a case where the thin-film transistor is not irradiated with IR light, and a thick dotted line 902 indicates a characteristic in a case where the thin-film transistor is irradiated with the IR light. From the dotted line portion denoted by reference numeral it is understood that the off-current greatly increases by the IR light irradiation.

Although the on-current and the off-current increase for all the transistors, the increase in the off-currents of the first initialization transistor T1 and the threshold voltage compensation transistor T2 greatly affects the display luminance. In this regard, when a thin-film transistor having a top gate structure has been adopted, the IR light is emitted from the back surface of the display unit, whereby the channel region of the thin-film transistor is irradiated with the IR light. This excites holes and electrons, resulting in a significant increase in off-current.

When the drive current increases as described above, the emission luminance of the organic EL element 61 becomes higher than the original luminance, and hence the display of the corresponding portion is visually recognized as a bright spot (the luminance of the pixel of the corresponding portion increases). FIG. 21 is a schematic diagram for explaining an increase in the luminance of a pixel. As illustrated in FIG.

21, a cover glass 91 is provided on the front surface of an organic EL module 92, and a protective sheet 93 is provided on the back surface thereof. A proximity sensor 94 is provided to be in contact with the protective sheet 93. The proximity sensor 94 includes an emitting unit 941 that emits infrared light and a light receiving unit 942 that receives reflected light of the infrared light. The organic EL element in the organic EL module 92 emits light, whereby lighting light is emitted from the display surface. In the IR light irradiation region, the drive current increases with the increase in the off-currents of the first initialization transistor T1 and the threshold voltage compensation transistor T2 as described above, such that the lighting light has high luminance.

Even when the IR light is turned off after the potential of the control node NG is changed by the IR light irradiation, the potential of the control node NG is maintained in the state after change. Therefore, even after the IR light is turned off, luminance display significantly different from desired luminance display is performed. This will be described with reference to FIGS. 22 and 23. A thick dotted line 903 in FIG. 22 and a thick dotted line 905 in FIG. 23 indicate the optical response of the display luminance in a case where the IR light irradiation is not performed, and a solid line 904 in FIG. 22 and a solid line 906 in FIG. 23 indicate the optical response of the display luminance in a case where the IR light irradiation is performed. Note that display with "white gradation value=255 (maximum gradation)" is performed in the case of FIG. 22, and display with "white gradation value=48" is performed in the case of FIG. 23. The IR light irradiation is performed at the timing of scan-off and emission-on with a pulse width of IR light of 1.9 ms and a duty ratio of 2.09%. It can be grasped from the thick dotted line 903 in FIG. 22 that the display luminance is maintained at about 1,000 cd/m$^2$ without the IR light irradiation when display with "white gradation value=255" is performed. As indicated by the solid line 904 in FIG. 22, when display with "white grayscale value=255" is performed, the display luminance increases to about 2,700 cd/m$^2$ at the IR light irradiation timing, and after the IR light is turned off, the display luminance slightly decreases but is maintained at about 2,500 cd/m$^2$ until the start of the next frame. Furthermore, from the thick dotted line 905 in FIG. 23, it can be grasped that the display luminance is maintained at about 30 cd/m$^2$ without the IR light irradiation when display with "white gradation value=48" is performed. As indicated by the solid line 906 in FIG. 23, when display with "white gradation value=48" is performed, the display luminance increases to about 1,400 cd/m$^2$ at the IR light irradiation timing, and the display luminance is maintained until the start time point of the next frame. As above, even after the IR light is turned off, luminance display significantly different from desired luminance display is performed.

When the drive current increases as described above, burn-in occurs due to high current stress at the corresponding portion after the IR light is turned off. Such burn-in can be visually recognized as a white spot or a black spot when the IR light is not emitted, depending on the surrounding luminance and the intensity of the IR light. That is, the burn-in causes deterioration in display quality.

Next, a description will be given of an influence on display or the like when the IR light irradiation is performed at the time of scan-on. In this case, the on-currents of the write control transistor T3, the drive transistor T4, and the threshold voltage compensation transistor T2 relatively increase during a period when the data signal is being written. Thus, the data signal is not written correctly, and desired gradation display is not performed until the data signal is written next (until the next frame period). For example, when a solid image is to be displayed, the display of the corresponding portion is different from the display around the portion. When the pixel circuit 60 illustrated in FIG. 6 has been adopted (when the drive transistor T4 is a P-channel transistor), the luminance of the corresponding portion becomes lower than the surrounding luminance, and the portion is instantaneously visually recognized by a viewer as a black spot (dirt). In this way, the display quality degrades.

FIG. 24 is a timing chart for explaining a known IR light irradiation timing. However, waveforms illustrated in FIG. 24 are an example, and it is assumed that a region in first to sixth rows in the display unit is an IR light irradiation region. A period in which a scanning signal SCAN is maintained at a high level is a scan-off period, and a period in which the scanning signal SCAN is maintained at a low level is a scan-on period. A period in which a light light-emission control signal EM is maintained at the high level is an emission-off period, and a period in which the light-emission control signal EM is maintained at the low level is an emission-on period. In the example illustrated in FIG. 24, the IR light irradiation is performed in periods indicated by arrows denoted by reference signs P91, P92, and P93. As described above, in related art, the IR light irradiation has been performed at any timing without synchronizing with a driving operation for image display. When the IR light irradiation is performed at any timing in this manner, for example, the pixel circuits 60 in the first row are irradiated with IR light at any one of the following timings (1) to (7).

(1) a period of scan-on and emission-off
(2) a period of scan-off and emission-off
(3) a period of scan-off and emission-on
(4) a period extending from above (1) to above (2)
(5) a period extending from above (2) to above (3)
(6) a period extending from above (3) to above (2)
(7) a period extending from above (2) to above (1)

The optical responses of the display luminance are different from each other in the above cases (1) to (7). For this reason, the luminance of a pixel in the IR light irradiation region may increase, or the luminance of the pixel in the IR light irradiation region may be lower than the luminance of surrounding pixels. In this way, the display quality degrades. For example, short-term burn-in occurs in a pixel with increased luminance. Then, in a period during which the IR light irradiation is not being performed, burn-in (white burn-in or black burn-in) is visually recognized in a spot shape in the IR light irradiation region. Further, long-term burn-in occurs due to the accumulation of the IR light irradiation to cause unrecoverable display defects.

Therefore, an object of the following disclosure is to suppress deterioration in display quality caused by IR light irradiation in a display device provided with a proximity sensor.

Means for Solving the Problems

A display device according to some embodiments of the present disclosure is a display device provided with a pixel circuit including a display element driven by a current, the display device including:
  a display unit that includes
    a plurality of the pixel circuits of a plurality of rows and
      a plurality of columns, a plurality of data signal lines configured to supply data signals to a plurality of the pixel circuits in corresponding respective columns, a plurality of scanning signal lines configured to control writing of the data signals into a plurality of the pixel circuits in corresponding respective rows, and a plurality of light-emission control lines configured to control whether to supply a current to the display element included in each of a plurality of the pixel circuits in the corresponding respective rows; and a proximity sensor that includes an emitting unit configured to emit infrared light from a back surface of the display unit, and a light receiving unit configured to receive reflected light of the infrared light, wherein in a display period during which an image is displayed on the display unit, the emitting unit emits the infrared light only in a period including a part of an infrared light irradiation region turn-off period during which the plurality of light-emission control lines are driven such that no current is supplied to the display element included in each of a plurality of the pixel circuits in each of rows corresponding to an infrared light irradiation region that is irradiated with the infrared light, the period being before a time point at which writing of the data signals into a plurality of the pixel circuits in each of rows corresponding to the infrared light irradiation region is started.

A display device according to some other embodiments of the present disclosure is a display device provided with a pixel circuit including a display element driven by a current, the display device including:

a display unit that includes a plurality of the pixel circuits of a plurality of rows and a plurality of columns, a plurality of data signal lines configured to supply data signals to a plurality of the pixel circuits in corresponding respective columns, and a plurality of scanning signal lines configured to control writing of the data signals into a plurality of the pixel circuits in corresponding respective rows; and a proximity sensor that includes an emitting unit configured to emit infrared light from a back surface of the display unit, and a light receiving unit configured to receive reflected light of the infrared light, wherein in a display period during which an image is displayed on the display unit, the emitting unit emits the infrared light only in a period including at least a part of a vertical retrace period, the period being before a time point at which selection of scanning signal lines each connected to a plurality of the pixel circuits in each of rows corresponding to an infrared light irradiation region that is irradiated with the infrared light is started.

A control method (for a proximity sensor) according to some embodiments of the present disclosure is a control method for a proximity sensor mounted on a display device, the display device including a display unit that includes a plurality of pixel circuits of a plurality of rows and a plurality of columns, each of the plurality of pixel circuits including a display element driven by a current, a plurality of data signal lines configured to supply data signals to a plurality of pixel circuits in corresponding respective columns, a plurality of scanning signal lines configured to control writing of the data signals into a plurality of pixel circuits in corresponding respective rows, and a plurality of light-emission control lines configured to control whether to supply a current to the display element included in each of a plurality of pixel circuits in the corresponding respective rows, the proximity sensor including an emitting unit configured to emit infrared light from a back surface of the display unit, and a light receiving unit configured to receive reflected light of the infrared light, the control method including:

an emission starting step of starting emission of the infrared light from the emitting unit; and an emission stopping step of stopping the emission of the infrared light from the emitting unit, wherein in a display period during which an image is displayed on the display unit, the emission starting step and the emission stopping step are performed in such a manner that the infrared light is emitted from the emitting unit only in a period including a part of an infrared light irradiation region turn-off period during which the plurality of light-emission control lines are driven such that no current is supplied to the display element included in each of a plurality of the pixel circuits in each of rows corresponding to an infrared light irradiation region that is irradiated with the infrared light, the period being before a time point at which writing of the data signals into a plurality of pixel circuits in each of rows corresponding to the infrared light irradiation region is started.

A control method (for a proximity sensor) according to some other embodiments of the present disclosure is a control method for a proximity sensor mounted on a display device, the display device including a display unit that includes a plurality of pixel circuits of a plurality of rows and a plurality of columns, each of the plurality of pixel circuits including a display element driven by a current, a plurality of data signal lines configured to supply data signals to a plurality of pixel circuits in corresponding respective columns, and a plurality of scanning signal lines configured to control writing of the data signals into a plurality of pixel circuits in corresponding respective rows, the proximity sensor including an emitting unit configured to emit infrared light from a back surface of the display unit, and a light receiving unit configured to receive reflected light of the infrared light, the control method including:

an emission starting step of starting emission of the infrared light from the emitting unit; and an emission stopping step of stopping the emission of the infrared light from the emitting unit, wherein in a display period during which an image is displayed on the display unit, the emission starting step and the emission stopping step are performed in such a manner that the infrared light is emitted from the emitting unit only in a period including at least a part of a vertical retrace period, the period being before a time point at which selection of scanning signal lines each connected to a plurality of pixel circuits in each of rows corresponding to an infrared light irradiation region that is irradiated with the infrared light is started.

Effects of the Invention

According to some embodiments of the present disclosure, in a display period during which an image is displayed, infrared light irradiation is performed only in a period including a part of a period during which all the display elements included in the infrared light irradiation region are maintained in a turn-off-state and before the start time point of the writing of the data signals into the pixel circuits in the infrared light irradiation region. When the infrared light irradiation is performed at such a timing, even if the charge voltages fluctuate in the pixel circuits in the infrared light irradiation region, the data signals are immediately written, so that desired luminance display is performed. In addition, since the infrared light irradiation is performed in a state where the drive current is not flowing in each of the pixel circuits included in the infrared light irradiation region, the luminance of each pixel does not increase in the infrared light irradiation region. Thus, burn-in does not occur. Moreover, the infrared light irradiation is not performed during the writing of the data signals into the pixel circuits in the infrared light irradiation region, thereby preventing the occurrence of a phenomenon that desired gradation display is not performed throughout a period until the next writing of the data signals after the infrared light irradiation. From the above, in the display device provided with the proximity sensor, deterioration in display quality caused by the infrared light irradiation is suppressed as compared with the known display device.

According to some other embodiments of the present disclosure, in a display period during which an image is displayed, infrared light irradiation is performed only in a period including a part of a vertical retrace period and before the start time point of the writing of the data signals into the pixel circuits in the infrared light irradiation region. When the infrared light irradiation is performed at such a timing, even if the charge voltages fluctuate in the pixel circuits in the infrared light irradiation region, the data signals are immediately written, so that the influence of the increase in luminance due to the infrared light irradiation can be reduced and desired luminance display is performed. Further, the infrared light irradiation is not performed during the writing of the data signals into the pixel circuits in the infrared light irradiation region, thereby preventing the occurrence of a phenomenon that desired gradation display is not performed throughout a period until the next writing of the data signals after the infrared light irradiation. From the above, in the display device provided with the proximity sensor, deterioration in display quality caused by the infrared light irradiation is suppressed as compared with the known display device.

BRIEF DESCRIPTION OF THE DRAWINGS

FIG. 12 is a diagram for explaining the effect of the first embodiment.

FIG. 24 is a timing chart for explaining a known IR light irradiation timing.

MODES FOR CARRYING OUT THE INVENTION

Embodiments will be described below with reference to the accompanying drawings. In the following description, it is assumed that i and j are integers of 2 or more, m is an integer of 1 or more and i or less, and n is an integer of 1 or more and j or less.

1. First Embodiment 1.1 Overall Configuration

Figure 2:
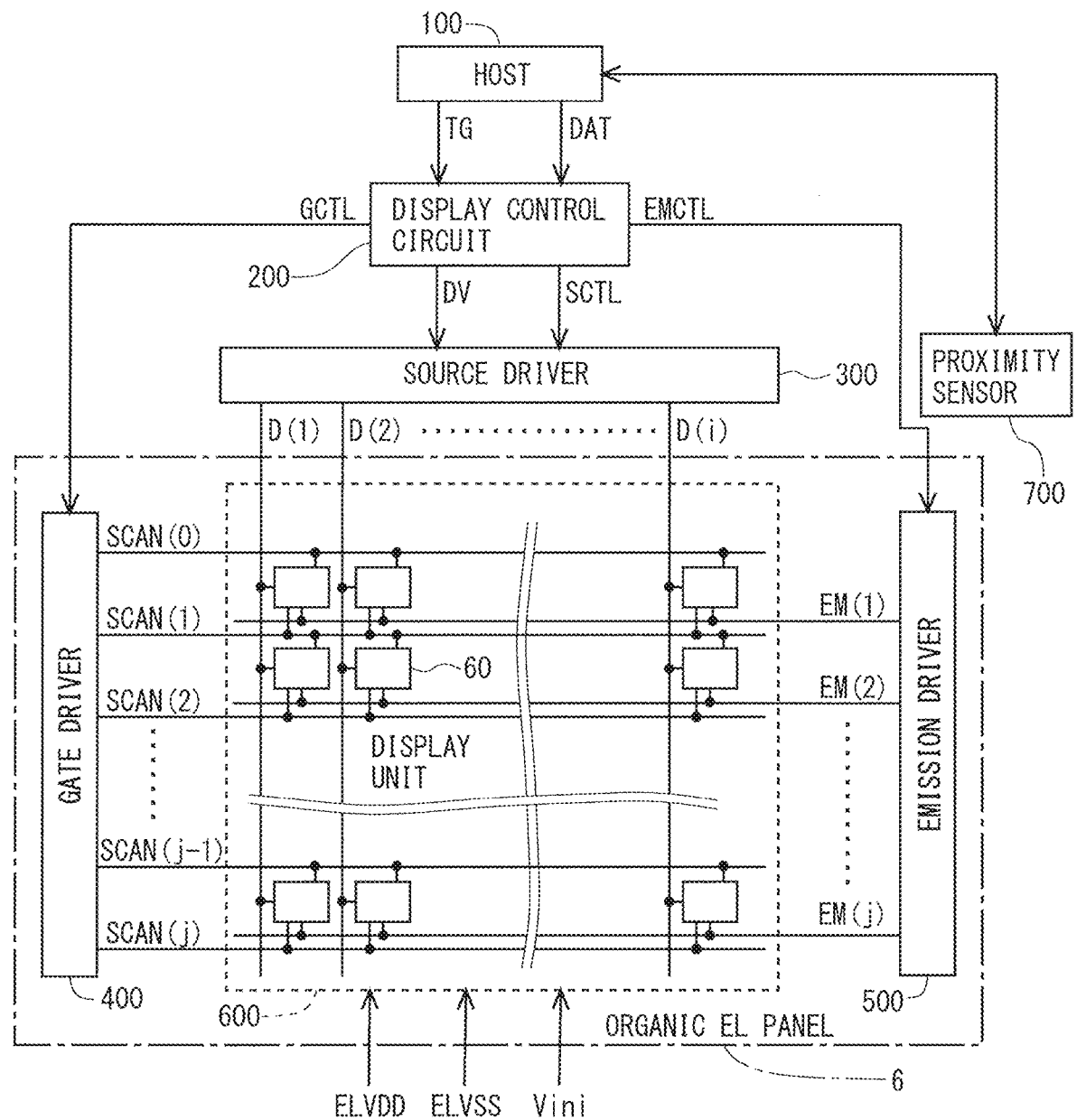
FIG. 2 is a block diagram illustrating an overall configuration of an organic EL display device according to the first embodiment.

FIG. 2 is a block diagram illustrating an overall configuration of the organic EL display device according to the first embodiment. As illustrated in FIG. 2, the organic EL display device includes a host 100, a display control circuit 200, a source driver (data signal line drive circuit) 300, a gate driver (scanning signal line drive circuit) 400, an emission driver (light-emission control line drive circuit) 500, a display unit 600, and a proximity sensor 700. In the present embodiment, the gate driver 400 and the emission driver 500 are formed in an organic EL panel 6 including the display unit 600. That is, the gate driver 400 and the emission driver 500 are monolithic. However, it is also possible to adopt a configuration in which the gate driver 400 and the emission driver 500 are not monolithic.

In the display unit 600, i data signal lines D(1) to D(i) and (j+1) scanning signal lines SCAN(0) to SCAN(j) orthogonal thereto are disposed. In the display unit 600, j light-emission control lines EM(1) to EM(j) are disposed to have a one-to-one correspondence with the j scanning signal lines SCAN(1) to SCAN(j) except for the scanning signal line SCAN(0). The scanning signal lines SCAN(0) to SCAN(j) and the light-emission control lines EM(1) to EM(j) are parallel to each other. Furthermore, in the display unit 600, i×j pixel circuits 60 are provided to correspond to the intersections of the i data signal lines D(1) to D(i) and the j scanning signal lines SCAN(1) to SCAN(j). By providing the i×j pixel circuits 60 in this manner, a pixel matrix of i columns and j rows is formed in the display unit 600. In the following, reference signs SCAN(0) to SCAN(j) may also be attached to scanning signals respectively provided to the (j+1) scanning signal lines SCAN(0) to SCAN(j), reference signs EM(1) to EM(j) may also be attached to light-emission control signals respectively provided to the j light-emission control lines EM(1) to EM(j), and reference signs D(1) to D(i) may also be attached to data signals respectively provided to the i data signal lines D(1) to D(i).

In the display unit 600, power lines (not illustrated) common to all the pixel circuits 60 are disposed. More specifically, a power line (hereinafter referred to as a "high-level power line") that supplies a high-level power supply voltage ELVDD for driving the organic EL element, a power line (hereinafter referred to as a "low-level power line") that supplies a low-level power supply voltage ELVSS for driving the organic EL element, and a power line (hereinafter referred to as an "initialization power line") that supplies an initialization voltage Vini are disposed. The high-level power supply voltage ELVDD, the low-level power supply voltage ELVSS, and the initialization voltage Vini are supplied from a power supply circuit (not illustrated). In the present embodiment, a first power line is achieved by the high-level power line, and a second power line is achieved by the low-level power line.

As will be described later, in the present embodiment, two adjacent light-emission control lines EM are grouped together as a set, and light-emission control signals having the same waveform are provided to two light-emission control lines EM of the same set. Therefore, the number of light-emission control lines EM in the display unit 600 may be set to (j/2), and one light-emission control line EM may be branched into two lines in the vicinity of the pixel circuit 60.

Hereinafter, the operation of each component illustrated in FIG. 2 will be described. The host 100 provides image data DAT and a timing signal group (horizontal synchronization signal, vertical synchronization signal, etc.) TG to the display control circuit 200. The host 100 also controls the operation of the proximity sensor 700 (e.g., controls an emission timing of IR light) and receives, from the proximity sensor 700, result data (data indicating whether or not an object exists at a close position) obtained by sensing.

The display control circuit 200 receives the image data DAT and the timing signal group TG which are transmitted from the host 100 and outputs a digital video signal DV, a source control signal SCTL for controlling the operation of the source driver 300, a gate control signal GCTL for controlling the operation of the gate driver 400, and an emission driver control signal EMCTL for controlling the operation of the emission driver 500. The source control signal SCTL includes a source start pulse signal, a source clock signal, a latch strobe signal, and the like. The gate control signal GCTL includes a gate start pulse signal, a gate clock signal, and the like. The emission driver control signal EMCTL includes an emission start pulse signal, an emission clock signal, and the like.

The source driver 300 is connected to the i data signal lines D(1) to D(i). The source driver 300 receives the digital video signal DV and the source control signal SCTL which are outputted from the display control circuit 200 and applies data signals to the i data signal lines D(1) to D(i). The source driver 300 includes an i-bit shift register, a sampling circuit, a latch circuit, i D/A converters, and the like (not illustrated). The shift register has i registers that are cascade-connected. The shift register sequentially transfers the pulse of the source start pulse signal supplied to the first-stage register from the input terminal to the output terminal on the basis of the source clock signal. The sampling pulse is outputted from each stage of the shift register in accordance with the transfer of the pulse. On the basis of the sampling pulse, the sampling circuit stores the digital video signal DV. The latch circuit captures and holds digital video signals DV for one row stored in the sampling circuit in accordance with the latch strobe signal. The D/A converter is provided to correspond to each of the data signal lines D(1) to D(i). The D/A converter converts the digital video signal DV held in the latch circuit into an analog voltage. The converted analog voltages are simultaneously applied to all the data signal lines D(1) to D(i) as data signals.

The gate driver 400 is connected to the (j+1) scanning signal lines SCAN(0) to SCAN(j). The gate driver 400 includes a shift register, a logic circuit, and the like. The gate driver 400 drives the (j+1) scanning signal lines SCAN(0) to SCAN(j) on the basis of the gate control signal GCTL outputted from the display control circuit 200.

The emission driver 500 is connected to the j light-light-emission control lines EM(1) to EM(j). The emission driver 500 includes a shift register, a logic circuit, and the like. The emission driver 500 drives the j light-emission control lines EM(1) to EM(j) on the basis of the emission driver control signal EMCTL outputted from the display control circuit 200.

The proximity sensor 700 detects the presence or absence of an object at a position close to the organic EL display device. Note that details of the proximity sensor 700 will be described later.

The i data signal lines D(1) to D(i), the (j+1) scanning signal lines SCAN(0) to SCAN(j), and the j light-emission control lines EM(1) to EM(j) are driven as described above, whereby an image based on the image data DAT is displayed on the display unit 600. Further, by the sensing by the proximity sensor 700, it is determined whether or not an object exists at a position close to the organic EL display device.

1.2 Proximity Sensor

Figure 3:
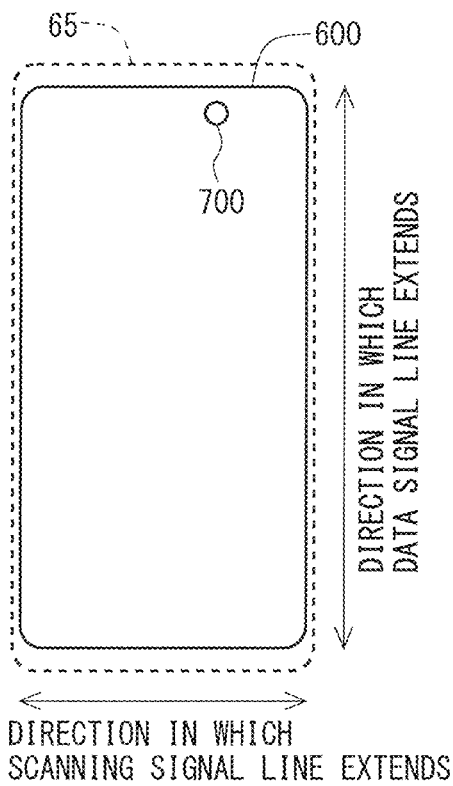
FIG. 3 is a diagram for explaining a position where a proximity sensor is provided in the first embodiment.
Figure 4:
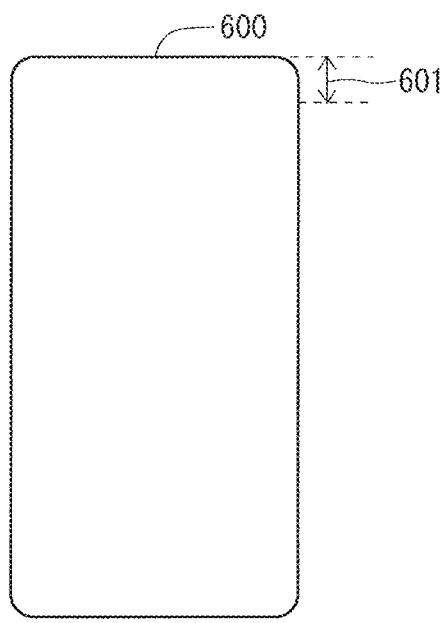
FIG. 4 is a diagram for explaining an IR light irradiation region in the first embodiment.

FIG. 3 is a diagram for explaining a position where the proximity sensor 700 is provided. In FIG. 3, a dotted line denoted by reference numeral 65 represents the housing of the organic EL display device. The proximity sensor 700 is provided, on the back surface of the display unit 600, on one end side in a direction in which the data signal lines D(1) to D(i) extend. With the proximity sensor 700 being disposed in this manner, in the present embodiment, a region indicated by an arrow denoted by reference numeral 601 in FIG. 4 is an IR light irradiation region. It is assumed here that a region in first to sixth rows in the display unit 600 is the IR light irradiation region 601.

Figure 5:
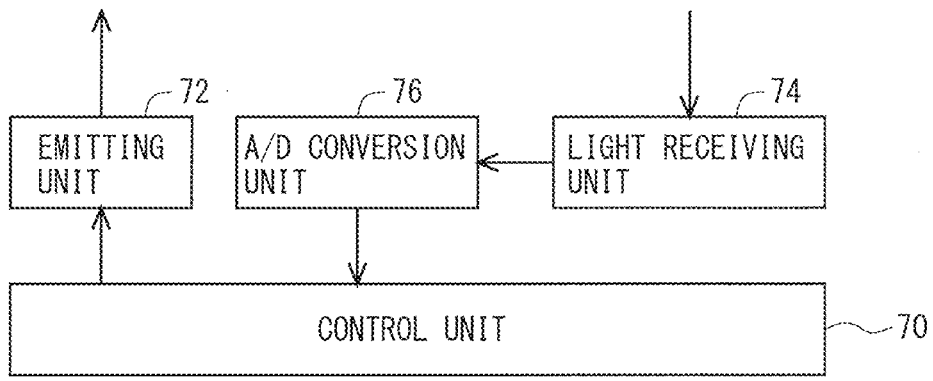
FIG. 5 is a block diagram illustrating the functional configuration of the proximity sensor in the first embodiment.

FIG. 5 is a block diagram illustrating the functional configuration of the proximity sensor 700. As illustrated in FIG. 5, the proximity sensor 700 includes a control unit an emitting unit 72, a light receiving unit 74, and an analog-to-digital (A/D) conversion unit 76. The emitting unit 72 emits infrared light (IR light) from the back surface of the display unit 600. The emitting unit 72 is constituted by, for example, an infrared light-emitting diode (LED) and receives the supply of a current from the control unit 70 to emit IR light. The light receiving unit 74 receives the reflected light of the IR light emitted from the emitting unit 72. The light receiving unit 74 is constituted by, for example, a photodiode and generates a measurement current corresponding to the amount of received light. The A/D conversion unit 76 performs A/D conversion on the basis of the measurement current and outputs a digital signal. The control unit 70 controls the emission timing of the IR light from the emitting unit 72. Specifically, the control unit supplies a predetermined current to the emitting unit 72 at the timing for causing the emitting unit 72 to emit the IR light. The control unit 70 also determines whether or not an object exists at a position close to the organic EL display device on the basis of the digital signal outputted from the A/D conversion unit 76.

Note that two or more proximity sensors 700 may be provided in the organic EL display device. However, even in such a case, it is assumed that only one proximity sensor 700 emits the IR light.

1.3 Pixel Circuit

1.3.1 Configuration of Pixel Circuit

Figure 6:
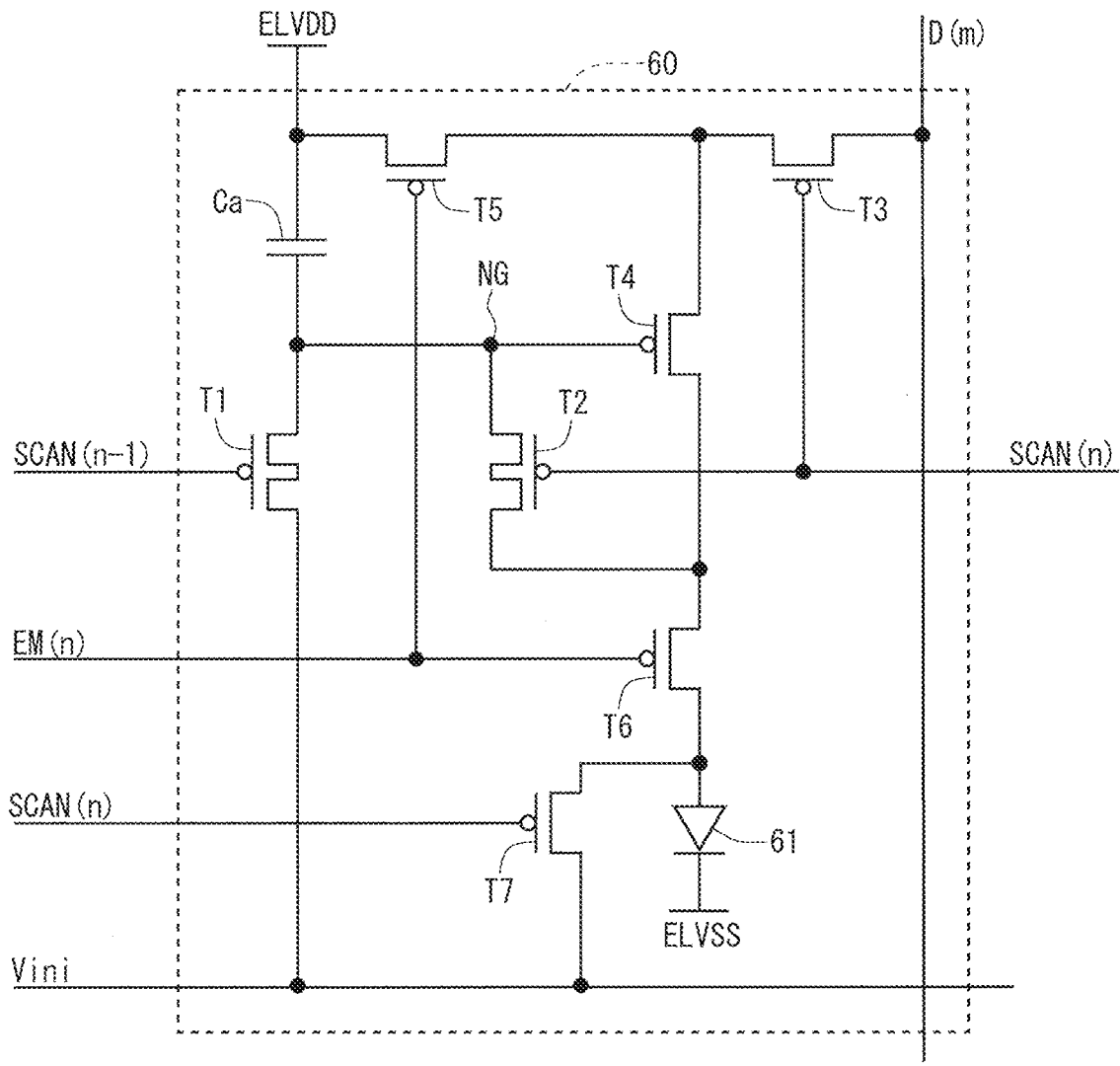
FIG. 6 is a circuit diagram illustrating a configuration of a pixel circuit in an nth row and an mth column in the first embodiment.

Next, the configuration of the pixel circuit 60 in the display unit 600 will be described. FIG. 6 is a circuit diagram illustrating a configuration of a pixel circuit 60 in an nth row and an mth column. The pixel circuit 60 includes one organic EL element (organic light-emitting diode) 61 as a display element (a display element driven by a current), seven transistors (typically thin-film transistors) T1 to T7 (first initialization transistor T1, threshold voltage compensation transistor T2, write control transistor T3, drive transistor T4, power supply control transistor T5, light-emission control transistor T6, second initialization transistor T7), and one holding capacitor Ca. The holding capacitor Ca is a capacitive element made up of two electrodes (first electrode and second electrode). The transistors T1 to T7 are P-channel transistors. The first initialization transistor T1 and the threshold voltage compensation transistor T2 have a dual-gate structure in which two transistors are connected in series. By adopting such a dual-gate structure, it is possible to obtain the effects of improving the breakdown voltage of the transistor and reducing the off-current.

Concerning the configuration illustrated in FIG. 6, a node connected to the first conduction terminal of the first initialization transistor T1, the second conduction terminal of the threshold voltage compensation transistor T2, the control terminal of the drive transistor T4, and the second electrode of the holding capacitor Ca is referred to as a "control node". The control node is denoted by reference sign NG.

Note that the configuration illustrated in FIG. 6 is an example, and it is not limited to this. For example, a pixel circuit including only an N-channel transistor can be adopted, or a pixel circuit in which a P-channel transistor and an N-channel transistor are mixed can be adopted. The first initialization transistor T1 and the threshold voltage compensation transistor T2 may not have a dual-gate structure.

The first initialization transistor T1 has a control terminal connected to the scanning signal line SCAN(n−1) in the (n−1)th row, a first conduction terminal connected to the control node NG, and a second conduction terminal connected to the initialization power line. The threshold voltage compensation transistor T2 has a control terminal connected to the scanning signal line SCAN(n) in the nth row, a first conduction terminal connected to the second conduction terminal of the drive transistor 14 and the first conduction terminal of the light-emission control transistor T6, and a second conduction terminal connected to the control node NG. The write control transistor T3 has a control terminal connected to the scanning signal line SCAN(n) in the nth row, a first conduction terminal connected to the data signal line D(m) in the mth column, and a second conduction terminal connected to the first conduction terminal of the drive transistor 14 and a second conduction terminal of the power supply control transistor T5. The drive transistor T4 has a control terminal connected to the control node NG, the first conduction terminal connected to the second conduction terminal of the write control transistor T3 and the second conduction terminal of the power supply control transistor T5, and the second conduction terminal connected to the first conduction terminal of the threshold voltage compensation transistor T2 and the first conduction terminal of the light-emission control transistor T6.

The power supply control transistor T5 has a control terminal connected to the light-emission control line EM(n) in the nth row, a first conduction terminal connected to the high-level power line and the first electrode of the holding capacitor Ca, and the second conduction terminal connected to the second conduction terminal of the write control transistor T3 and the first conduction terminal of the drive transistor 14. The light-emission control transistor T6 has a control terminal connected to the light-emission control line EM(n) in the nth row, the first conduction terminal connected to the first conduction terminal of the threshold voltage compensation transistor T2 and the second conduction terminal of the drive transistor T4, and a second conduction terminal connected to the first conduction terminal of the second initialization transistor T7 and the anode terminal (first terminal) of the organic EL element 61. The second initialization transistor T7 has a control terminal connected to the scanning signal line SCAN(n) in the nth row, the first conduction terminal connected to the second conduction terminal of the light-emission control transistor T6 and the anode terminal of the organic EL element 61, and a second conduction terminal connected to the initialization power line. The holding capacitor Ca has the first electrode connected to the high-level power line and the first conduction terminal of the power supply control transistor T5, and the second electrode connected to the control node NG. The organic EL element 61 has the anode terminal connected to the second conduction terminal of the light-emission control transistor T6 and the first conduction terminal of the second initialization transistor T7, and a cathode terminal (second terminal) connected to the low-level power line.

1.3.2 Operation of Pixel Circuit

Figure 7:
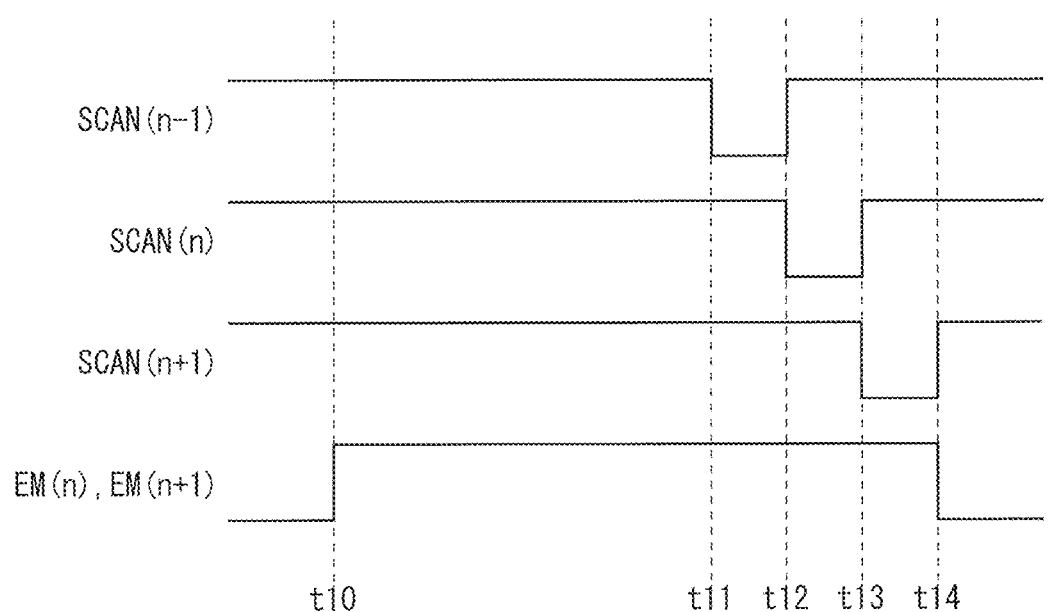
FIG. 7 is a timing chart for explaining the operation of the pixel circuit in the first embodiment.

Next, the operation of the pixel circuit 60 will be described with reference to FIG. 7. Here, attention is focused on the pixel circuits 60 in the nth row and the (n+1)th row to which the light-emission control signals EM having the same waveform are provided.

In a period prior to a time immediately before time t10, the scanning signals SCAN(n−1), SCAN(n), SCAN(n+1) are at a high level, and the light-emission control signals EM(n), EM(n+1) are at a low level. In this period, in both the pixel circuit 60 in the nth row and the pixel circuit 60 in the (n+1)th row, the power supply control transistor T5 and the light-emission control transistor T6 are in an on-state, and the organic EL element 61 is emitting light in accordance with the magnitude of the drive current.

At time t10, the light-emission control signals EM(n), EM(n+1) change from the low level to the high level. Thereby, in both the pixel circuit 60 in the nth row and the pixel circuit 60 in the (n+1)th row, the power supply control transistor T5 and the light-emission control transistor T6 come into the off-state. As a result, the supply of the current to the organic EL element 61 is cut off, and the organic EL element 61 comes into a turn-off state.

At time t11, the scanning signal SCAN(n−1) changes from the high level to the low level. Thus, in the pixel circuit 60 in the nth row, the first initialization transistor T1 comes into the on-state, and the gate voltage of the drive transistor T4 (the voltage of the control node NG) is initialized. That is, the gate voltage of the drive transistor T4 in the pixel circuit 60 in the nth row becomes equal to the initialization voltage Vini.

At time t12, the scanning signal SCAN(n−1) changes from the low level to the high level. Thus, in the pixel circuit 60 in the nth row, the first initialization transistor T1 comes into the off-state. At time t12, the scanning signal SCAN(n) changes from the high level to the low level. Thus, in the pixel circuit 60 in the nth row, the threshold voltage compensation transistor T2, the write control transistor T3, and the second initialization transistor T7 come into the on-state. By the threshold voltage compensation transistor T2 and the write control transistor T3 coming into the on-state, the data signal D(m) is provided to the control node NG via the write control transistor T3, the drive transistor T4, and the threshold voltage compensation transistor T2. As a result, the holding capacitor Ca is charged. By the second initialization transistor T7 coming into the on-state, the anode voltage of the organic EL element 61 is initialized on the basis of the initialization voltage Vini. In the pixel circuit 60 in the (n+1)th row, by the scanning signal SCAN(n) changing from the high level to the low level, the first initialization transistor T1 comes into the on-state, and the gate voltage of the drive transistor T4 is initialized. That is, the gate voltage of the drive transistor 14 in the pixel circuit 60 in the (n+1)th row becomes equal to the initialization voltage Vini.

At time t13, the scanning signal SCAN(n) changes from the low level to the high level. Thus, in the pixel circuit in the nth row, the threshold voltage compensation transistor T2, the write control transistor T3, and the second initialization transistor T7 come into the off-state. At this time, in the pixel circuit 60 in the (n+1)th row, the first initialization transistor T1 comes into the off-state. Furthermore, at time t13, the scanning signal SCAN(n+1) changes from the high level to the low level. Thus, in the pixel circuit 60 in the (n+1)th row, the threshold voltage compensation transistor T2, the write control transistor T3, and the second initialization transistor T7 come into the on-state. By the threshold voltage compensation transistor T2 and the write control transistor T3 coming into the on-state, the data signal D(m) is provided to the control node NG via the write control transistor T3, the drive transistor T4, and the threshold voltage compensation transistor T2. As a result, the holding capacitor Ca is charged. By the second initialization transistor T7 coming into the on-state, the anode voltage of the organic EL element 61 is initialized on the basis of the initialization voltage Vini.

At time t14, the scanning signal SCAN(n+1) changes from the low level to the high level. Thus, in the pixel circuit 60 in the (n+1)th row, the threshold voltage compensation transistor T2, the write control transistor T3, and the second initialization transistor T7 come into the off-state. At time t14, the light-emission control signals EM(n), EM(n+1) change from the high level to the low level. Thereby, in both the pixel circuit 60 in the nth row and the pixel circuit 60 in the (n+1)th row, the power supply control transistor T5 and the light-emission control transistor T6 come into the on-state, and the drive current corresponding to the charge voltage of the holding capacitor Ca is supplied to the organic EL element 61. As a result, in both the pixel circuit 60 in the nth row and the pixel circuit 60 in the (n+1)th row, the organic EL element 61 emits light in accordance with the magnitude of the drive current. Thereafter, the organic EL element 61 emits light in both the pixel circuit 60 in the nth row and the pixel circuit 60 in the (n+1)th row throughout a period until the next light-emission control signals EM(n), EM(n+1) change from the low level to the high level.

1.4 Control of Infrared Light (IR Light) Irradiation Timing

1.4.1 During Image Display

Figure 1:
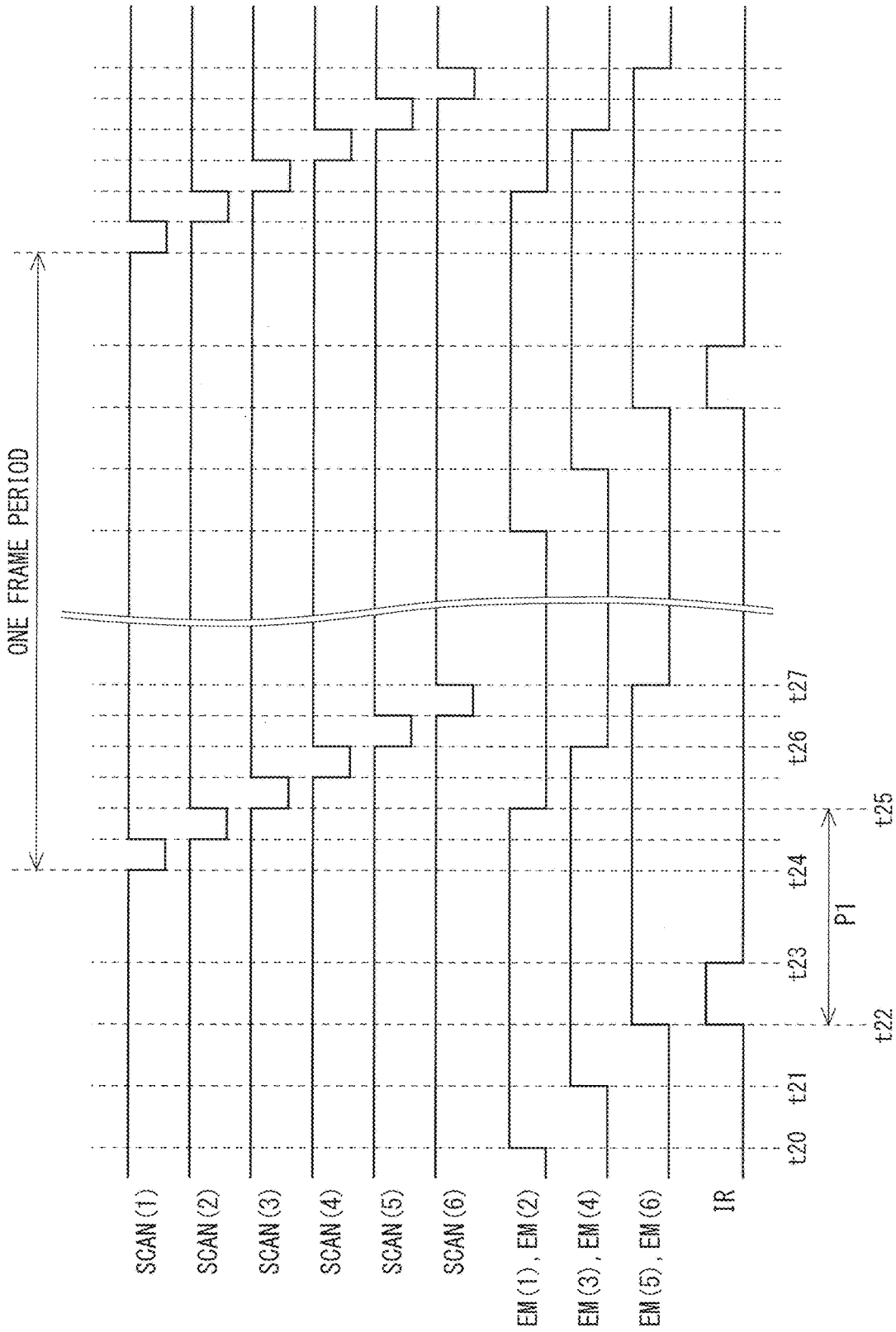
FIG. 1 is a timing chart for explaining an IR light irradiation timing in a period during which an image is displayed on a display unit in a first embodiment.

FIG. 1 is a timing chart for explaining an IR light irradiation timing in a period during which an image is displayed on the display unit 600. As can be grasped from FIG. 1, in the present embodiment, light-emission control signals having the same waveform are provided to every two light-emission control lines EM. That is, two adjacent light-emission control lines EM are grouped together as a set, and light-emission control signals having the same waveform are provided to the two light-emission control lines EM in the same set.

As described above, in the present embodiment, the region in the first to sixth rows in the display unit 600 is the IR light irradiation region 601. Concerning the IR light irradiation region 601, as can be grasped from the waveforms of the light-emission control signals EM illustrated in FIG. 1, the supply of the current to the organic EL element 61 is cut off in the pixel circuits 60 in the first row and the second row during the period from time t20 to time t25, the supply of the current to the organic EL element 61 is cut off in the pixel circuits 60 in the third row and the fourth row during the period from time t21 to time t26, and the supply of the current to the organic EL element 61 is cut off in the pixel circuits 60 in the fifth row and the sixth row during the period from time t22 to time t27. Therefore, in a period P1 from time t22 to time t25, the organic EL element 61 is maintained in the turn-off state in all the pixel circuits 60 in the IR light irradiation region 601. Hereinafter, such a period P1 is referred to as an "IR light irradiation region turn-off period".

Further, as can be grasped from FIG. 1, the data signals are written into the pixel circuits 60 in the IR light irradiation region 601 sequentially row by row in the period from time t24 to time t27. That is, the writing of the data signals into the pixel circuits 60 in the IR light irradiation region 601 is started at time t24.

Here, in the present embodiment, the IR light irradiation (the emission of the IR light from the emitting unit 72 of the proximity sensor 700) is performed in the period from time t22 to time t23. That is, the IR light irradiation is performed in a part of a period before the time point (time t24) of starting the writing of the data signals into the pixel circuits 60 in the IR light irradiation region 601 among the IR light irradiation region turn-off period P1 described above. In this way, the IR light irradiation is performed during a period during which all the rows in the IR light irradiation region 601 are in the emission-off and scan-off state. In order to achieve this, a period during which each pixel circuit 60 is maintained in the emission-off-state is made longer than a period in which the data signals are written into all the pixel circuits 60 in the IR light irradiation region 601. In other words, the light-emission control lines EM are driven such that a period during which the organic EL element 61 included in each pixel circuit 60 is maintained in a state in which no current is supplied is longer than a period during which the scanning signal lines SCAN are driven so as to cause data signals to be written into all the pixel circuits 60 in the IR light irradiation region 601 row by row.

As above, the emitting unit 72 of the proximity sensor 700 emits the IR light only in a period including a part of the IR light irradiation region turn-off period P1 during which the light-emission control lines EM are driven such that no current is supplied to the organic EL element 61 included in each of the pixel circuits 60 in each of rows corresponding to the IR light irradiation region 601 and before the time point at which the writing of the data signals into the pixel circuits 60 in each of rows corresponding to the IR light irradiation region 601 is started. Here, the whole of the period during which the IR light is emitted from the emitting unit 72 is included in the IR light irradiation region turn-off period P1.

Although the two light-emission control lines EM are grouped together as a set in the present embodiment, the number of light-emission control lines EM equal to the number of rows included in the IR light irradiation region 601 may be grouped together as a set. In the above example where the region in the first to sixth rows in the display unit 600 is the IR light irradiation region 601, six light-emission control lines EM may be grouped together as a set, and the light-emission control signals having the same waveform may be provided to the six light-emission control lines EM in the same set. In addition, although the emission-off period is provided for each row in order to write a data signal, an emission-off period for the purpose of dimming or the like may be provided separately from when the data signal is written.

In the present embodiment, an emission starting step is achieved by the operation of the proximity sensor 700 at time t22 in FIG. 1, and an emission stopping step is achieved by the operation of the proximity sensor 700 at time t23 in FIG. 1.

1.4.2 During No Image Display

In the present embodiment, in a period during which no image is displayed on the display unit 600 (a period during which the power supply to the pixel circuit 60 is stopped), such as when the organic EL display device has been set in a power saving mode, the IR light is emitted from the emitting unit 72 of the proximity sensor 700 at any timing.

Figure 8:
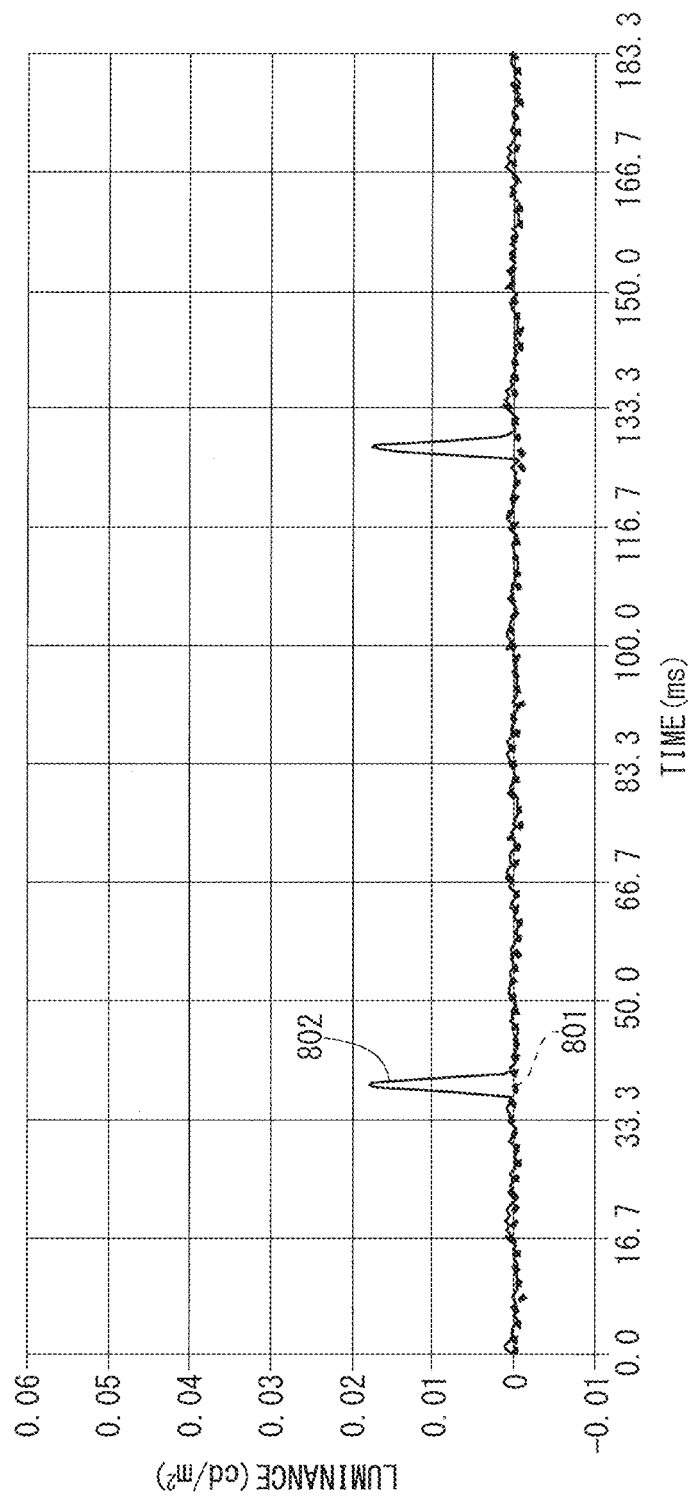
FIG. 8 is a diagram illustrating an optical response of display luminance in a state where a driving operation for image display is stopped in the first embodiment.

FIG. 8 is a diagram illustrating an optical response of display luminance in a state where a driving operation for image display is stopped. A thick dotted line 801 indicates the optical response of the display luminance in the case where the IR light irradiation is not performed, and a solid line 802 indicates the optical response of the display luminance in the case where the IR light irradiation is performed. As can be grasped from FIG. 8, in the case where the IR light irradiation is performed, a peak luminance of about 0.018 cd/m$^2$ appears. However, the level of this peak luminance is a level at which the characteristics of the transistors in the pixel circuit 60 are hardly affected. That is, the appearance of such peak luminance does not cause deterioration in display quality.

As above, in a state where the driving operation for image display is stopped, the IR light irradiation does not cause deterioration in display quality regardless of the IR light irradiation timing. Hence the IR light irradiation is performed at any timing in a period during which no image is displayed. In other words, in a period during which no image is displayed, the emitting unit 72 of the proximity sensor 700 emits the IR light without synchronizing with the driving operation of the data signal lines D, the scanning signal lines SCAN, and the light-emission control lines EM.

1.5 Effects

According to the present embodiment, during the image display, the IR light irradiation is performed in a period before the start time point of the writing of the data signals into the pixel circuits 60 in the IR light irradiation region 601 among a period during which the organic EL elements 61 in all the pixel circuits 60 included in the IR light irradiation region 601 are maintained in the turn-off state (IR light irradiation region turn-off period P1). When the IR light irradiation is performed at such a timing, even if the charge voltages of the holding capacitors Ca in the pixel circuits 60 included in the IR light irradiation region 601 fluctuate, the data signals are immediately written into the holding capacitors Ca, so that desired luminance display is performed. In addition, since the IR light irradiation is performed in a state where the drive current is not flowing in each of the pixel circuits 60 included in the IR light irradiation region 601, the luminance of the pixel does not increase in the IR light irradiation region 601. Thus, burn-in does not occur. Moreover, the IR light irradiation is not performed during the writing of the data signals into the pixel circuits 60 in the IR light irradiation region 601, thereby preventing the occurrence of a phenomenon that desired gradation display is not performed throughout a period until the next writing of the data signal is performed after the IR light irradiation. From the above, in the organic EL display device provided with the proximity sensor, deterioration in display quality caused by the IR light irradiation is suppressed as compared with the related art.

Figure 9:
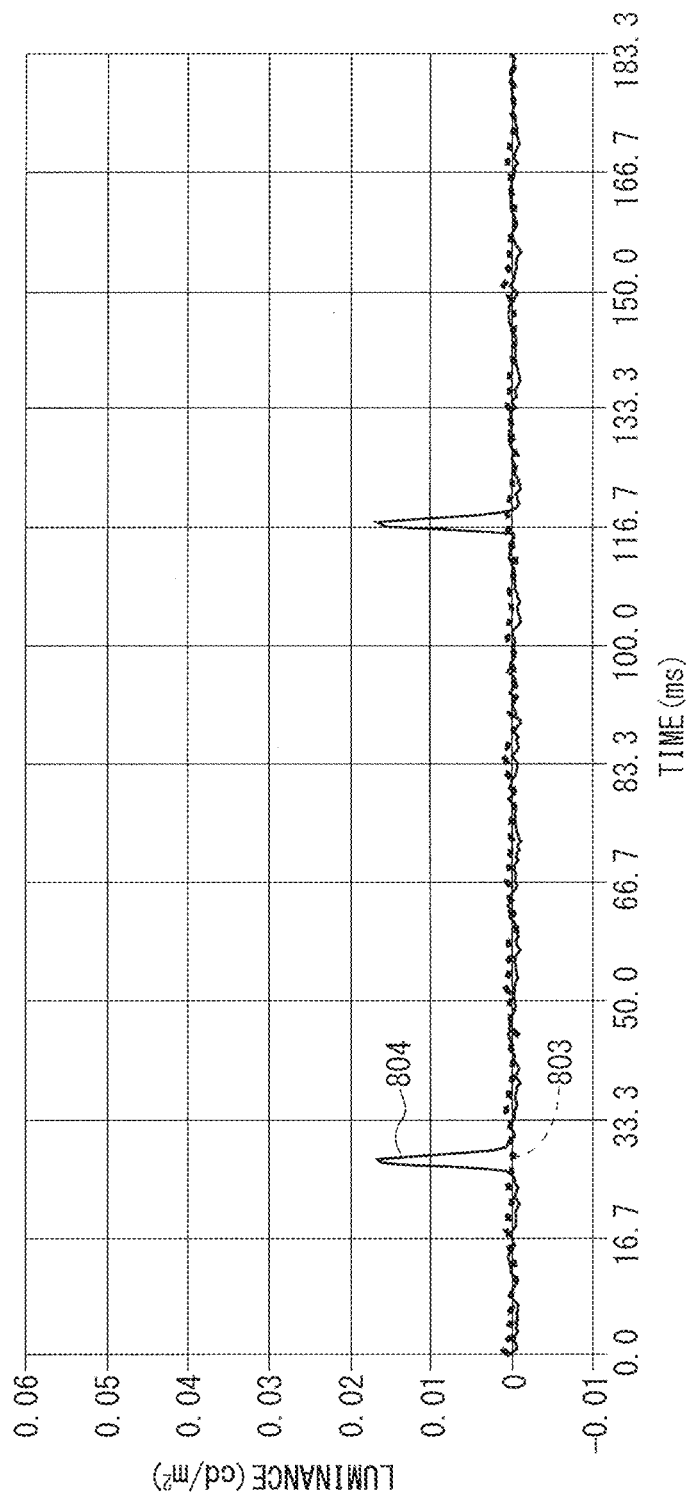
FIG. 9 is a diagram for explaining the effect of the first embodiment.
Figure 10:
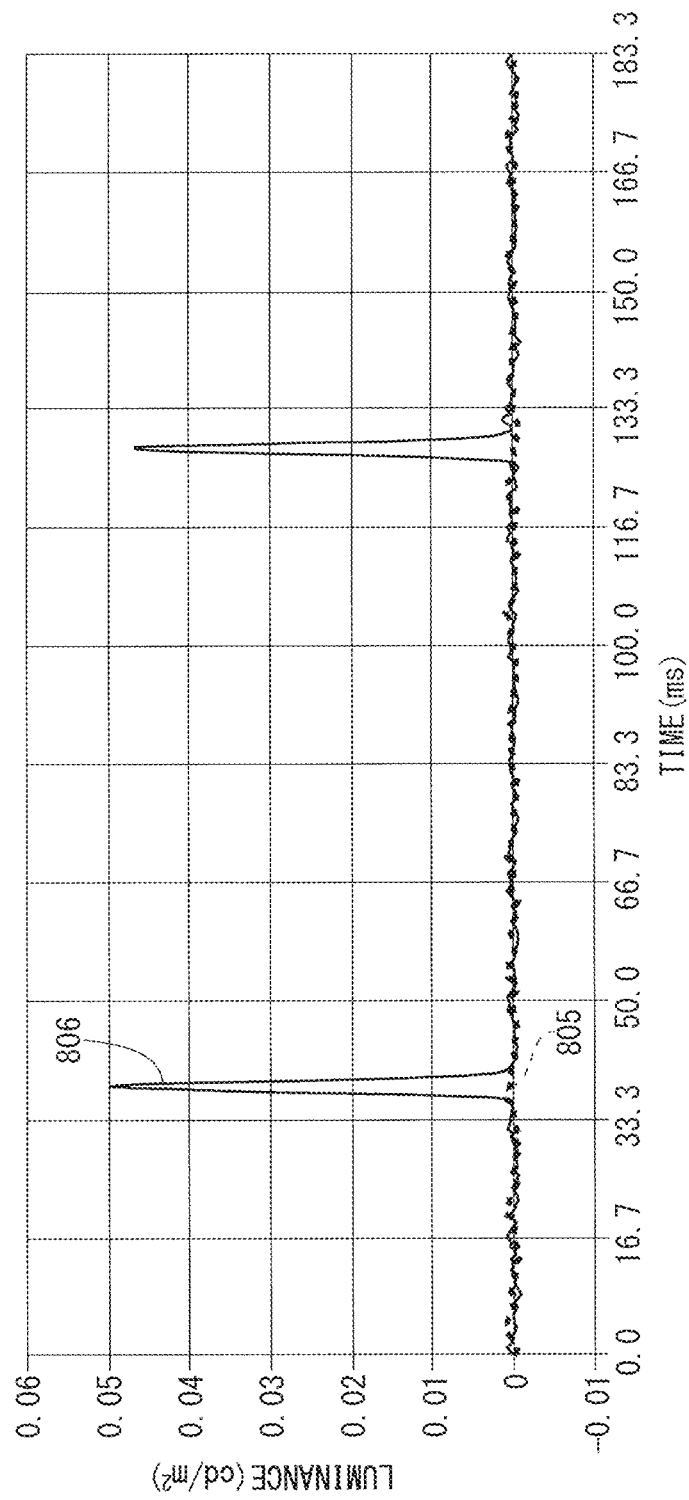
FIG. 10 is a diagram for explaining the effect of the first embodiment.
Figure 11:
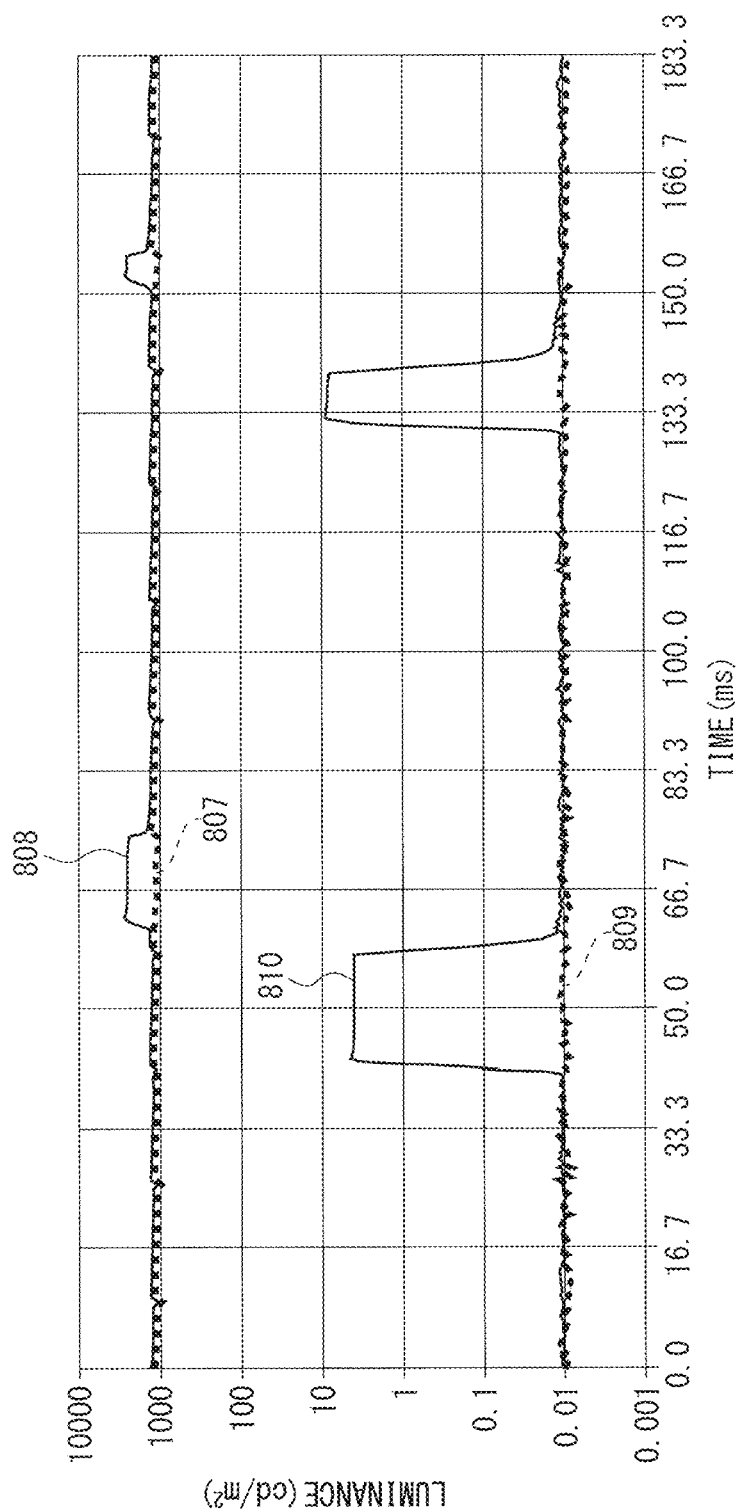
FIG. 11 is a diagram for explaining the effect of the first embodiment.

The effect of the present embodiment will be further described with reference to FIGS. 9 to 12. A solid line 804 in FIG. 9 indicates the optical response of the display luminance in a case where display with "white gradation value=255 (maximum gradation)" is performed and the IR light irradiation is performed during the emission-off period, and a thick dotted line 803 in FIG. 9 indicates the optical response of the display luminance in a case where display with "white gradation value=255" is performed and the IR light irradiation is not performed. Further, a solid line 806 in FIG. 10 indicates the optical response of the display luminance in a case where display with "white gradation value=0" is performed and the IR light irradiation is performed during the emission-off period, and a thick dotted line 805 in FIG. 10 indicates the optical response of the display luminance in a case where display with "white gradation value=0" is performed and the IR light irradiation is not performed. Focusing on the cases where the IR light irradiation is performed, a peak luminance of about 0.018 cd/m$^2$ appears when display with "white gradation value=255" is performed, and a peak luminance of about 0.05 cd/m$^2$ appears when display with "white gradation value=0" is performed. A solid line 808 in FIG. 11 indicates the optical response of the display luminance in a case where display with "white gradation value=255" is performed and the IR light irradiation is performed during the emission-on period, and a thick dotted line 807 in FIG. 11 indicates the optical response of the display luminance in a case where display with "white gradation value=255" is performed and the IR light irradiation is not performed. Further, a solid line 810 in FIG. 11 indicates the optical response of the display luminance in a case where display with "white gradation value=0" is performed and the IR light irradiation is performed during the emission-on period, and a thick dotted line 809 in FIG. 11 indicates the optical response of the display luminance in a case where display with "white gradation value=0" is performed and the IR light irradiation is not performed. Focusing on the cases where the IR light irradiation is performed in FIG. 11, a peak luminance of about 2500 cd/m$^2$ appears when display with "white gradation value=255" is performed, and a peak luminance of about 5 to 10 cd/m$^2$ appears when display with "white gradation value=0" is performed. The results of the optical responses illustrated in FIGS. 9 to 11 are summarized in the table illustrated in FIG. 12. In FIG. 12, a pulse area corresponds to display luminance. Focusing on the case where display with "white gradation value=0" is performed, it is grasped from a portion denoted by reference numeral 811 in FIG. 12 that the display luminance in the case where the IR light irradiation is performed during the emission-off period is about ⅓₅₀₀ of the display luminance in the case where the IR light irradiation is performed during the emission-on period. From the above, according to the present embodiment in which the IR light irradiation is performed during the period during which the IR light irradiation region 601 is in the emission-off-state, the luminance of the pixel in the IR light irradiation region 601 does not increase, and deterioration in display quality due to the characteristic change of the transistor in the IR light irradiation region 601 is suppressed.

1.6 Modifications 1.6.1 First Modification

In the first embodiment, as illustrated in FIG. 1, the whole of the period during which the IR light irradiation is performed is included in the IR light irradiation region turn-off period P1 described above. However, it is not limited to this, and the IR light irradiation may be started from a time point before the start time point of the IR light irradiation region turn-off period P1. That is, the IR light irradiation may be started before the state changes from the emission-on-state to the emission-off-state in some rows in the IR light irradiation region 601.

Figure 13:
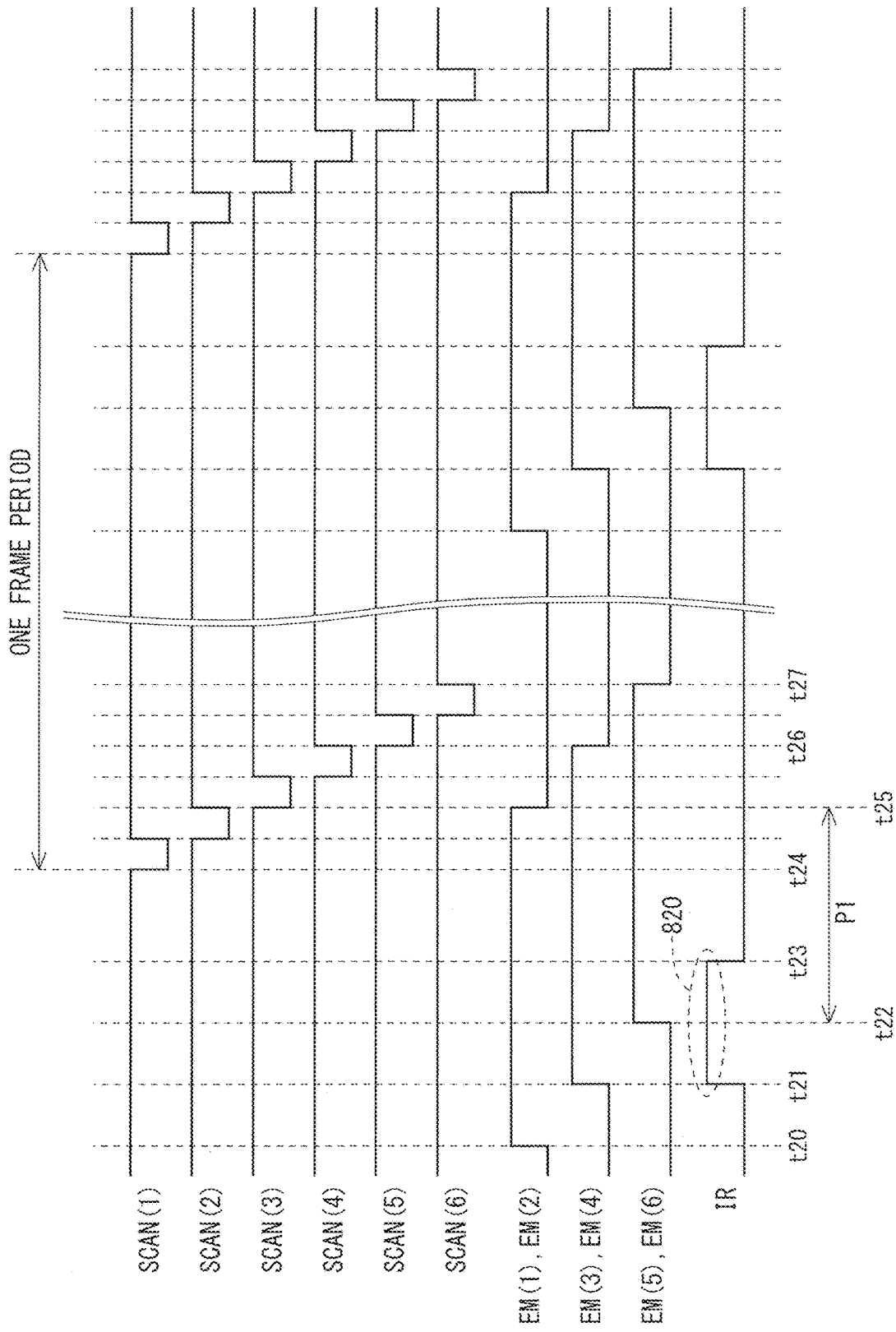
FIG. 13 is a timing chart for explaining an IR light irradiation timing in a period during which an image is displayed on a display unit in a first modification of the first embodiment.

FIG. 13 is a timing chart for explaining an IR light irradiation timing in the present modification. In the first embodiment, the IR light irradiation is performed in the period from time t22 to time t23, but in the present modification, the IR light irradiation is performed in the period from time t21 to time t23 (cf. a portion indicated by a dotted line denoted by reference numeral 820 in FIG. 13). When the IR light irradiation is performed during the period during which the IR light irradiation region 601 is in the emission-on-state, the luminance of the pixels in the IR light irradiation region 601 may increase. However, so long as visibility is not greatly affected, the IR light irradiation may be started before the state changes from the emission-on-state to the emission-off-state in some rows in the IR light irradiation region 601, as in the present modification.

1.6.2 Second Modification

Although the pixel circuit 60 having the configuration illustrated in FIG. 6 has been used in the first embodiment, the configuration of the pixel circuit 60 is not particularly limited. For example, the present disclosure can also be applied to a case where a pixel circuit 60 having a configuration illustrated in FIG. 14 is used.

Figure 14:
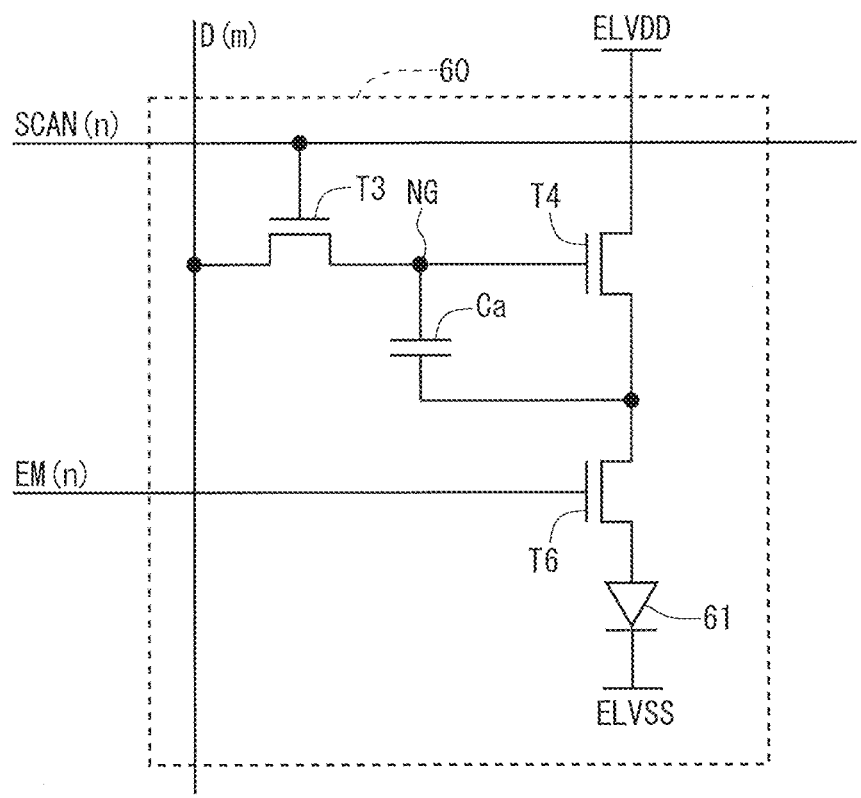
FIG. 14 is a circuit diagram illustrating a configuration of a pixel circuit in the nth row and the mth column in a second modification of the first embodiment.

The pixel circuit 60 illustrated in FIG. 14 includes one organic EL element 61 as a display element, three transistors (write control transistor T3, drive transistor T4, and light-emission control transistor T6), and one holding capacitor Ca. In this example, the three transistors are N-channel transistors. In the present modification, the initialization power line is unnecessary.

The write control transistor T3 has a control terminal connected to the scanning signal line SCAN(n) in the nth row, a first conduction terminal connected to the data signal line D(m) in the mth column, and a second conduction terminal connected to the control node NG. The drive transistor T4 has a control terminal connected to the control node NG, a first conduction terminal connected to the high-level power line, and a second conduction terminal connected to the first conduction terminal of the light-emission control transistor T6 and the second electrode of the holding capacitor Ca. The light-emission control transistor T6 has a control terminal connected to the light-emission control line EM(n) in the nth row, the first conduction terminal connected to the second conduction terminal of the drive transistor T4 and the second electrode of the holding capacitor Ca, and a second conduction terminal connected to the anode terminal of the organic EL element 61. The holding capacitor Ca has a first electrode connected to the control node NG, and the second electrode is connected to the second conduction terminal of the drive transistor T4 and the first conduction terminal of the light-emission control transistor T6. The organic EL element 61 has the anode terminal connected to the second conduction terminal of the light-emission control transistor T6, and a cathode terminal connected to the low-level power line.

The IR light irradiation timing may be controlled in the same manner as in the first embodiment or the first modification. Note that, since the N-channel transistors are used as described above, the waveforms of the scanning signals SCAN and the light-emission control signals EM illustrated in FIGS. 1 and 13 are inverted between the high level and the low level in the present modification.

2. Second Embodiment 2.1 Overall Configuration and the Like

Figure 15:
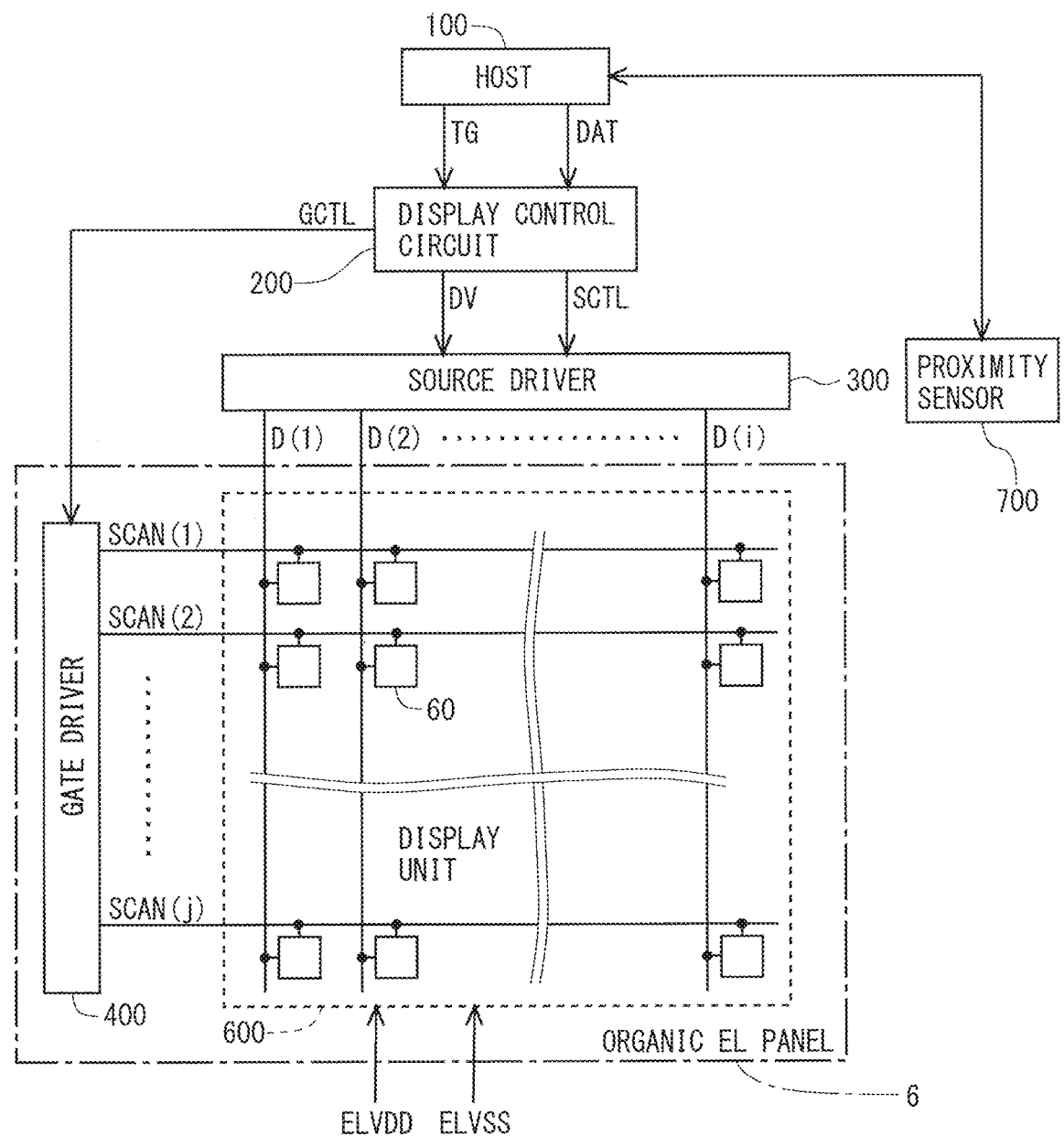
FIG. 15 is a block diagram illustrating an overall configuration of an organic EL display device according to a second embodiment.

FIG. 15 is a block diagram illustrating an overall configuration of an organic EL display device according to a second embodiment. Unlike the first embodiment, in the present embodiment, the j light-emission control lines EM(1) to EM(j) and the emission drivers 500 that drive those light-emission control lines are not provided. Therefore, a driving method is adopted in which a current is always supplied to the organic EL element 61 in the pixel circuit 60 throughout the period during which image display is performed. In the present embodiment, no initialization power line is provided. The configuration of the proximity sensor 700 is similar to that of the first embodiment (cf. FIGS. 3 to 5). That is, the proximity sensor 700 is provided, on the back surface of the display unit 600, on one end side (near the scanning signal line SCAN(1) of the first row) in a direction in which the data signal lines D(1) to D(i) extend. In addition, the scanning signal lines SCAN come into a selected state (here, a state in which a high-level scanning signal is being provided) in the order of "the first row, the second row, . . . , the (j−1)th row, and the jth row".

2.2 Pixel Circuit

2.2.1 Configuration of Pixel Circuit

Figure 16:
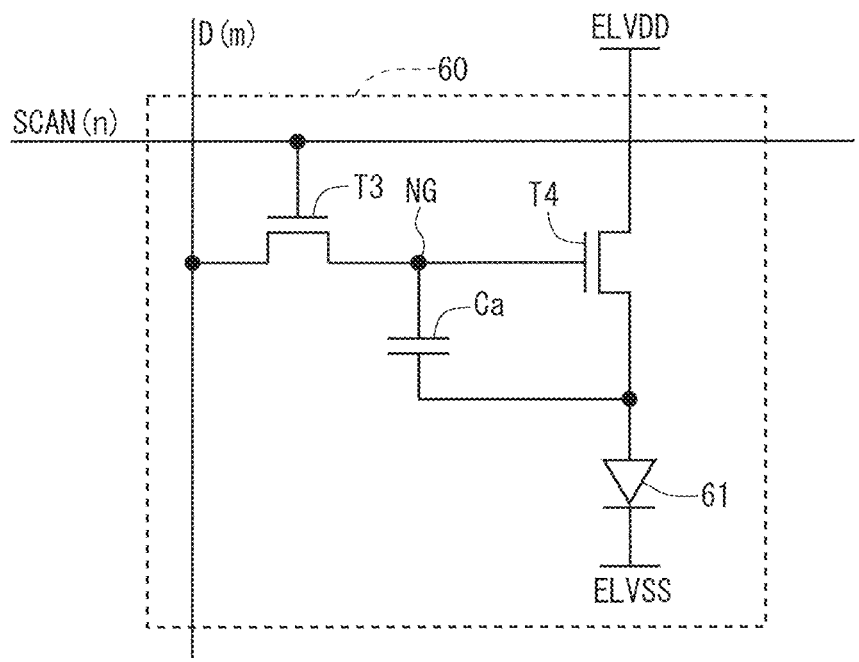
FIG. 16 is a circuit diagram illustrating a configuration of a pixel circuit in the nth row and the mth column in the second embodiment.

FIG. 16 is a circuit diagram illustrating a configuration of a pixel circuit 60 in the nth row and the mth column. The pixel circuit 60 includes one organic EL element 61 as a display element, two transistors (write control transistor T3 and drive transistor T4), and one holding capacitor Ca. The write control transistor T3 and the drive transistor T4 are N-channel transistors. As can be grasped from FIG. 16, the light-emission control transistor T6 that controls the supply of the drive current to the organic EL element 61 is not provided.

The write control transistor T3 has a control terminal connected to the scanning signal line SCAN(n) in the nth row, a first conduction terminal connected to the data signal line D(m) in the mth column, and a second conduction terminal connected to the control node NG. The drive transistor T4 has a control terminal connected to the control node NG, a first conduction terminal connected to the high-level power line, and a second conduction terminal connected to the second electrode of the holding capacitor Ca and the anode terminal of the organic EL element 61. The holding capacitor Ca has a first electrode connected to the control node NG, and the second electrode connected to the second conduction terminal of the drive transistor T4 and the anode terminal of the organic EL element 61. The organic EL element 61 has the anode terminal connected to the second conduction terminal of the drive transistor T4 and the second electrode of the holding capacitor Ca, and a cathode terminal connected to a low-level power line.

Note that the configuration of the pixel circuit 60 illustrated here is an example, and the pixel circuit 60 having another configuration can also be adopted.

2.2.2 Operation of Pixel Circuit

Figure 17:
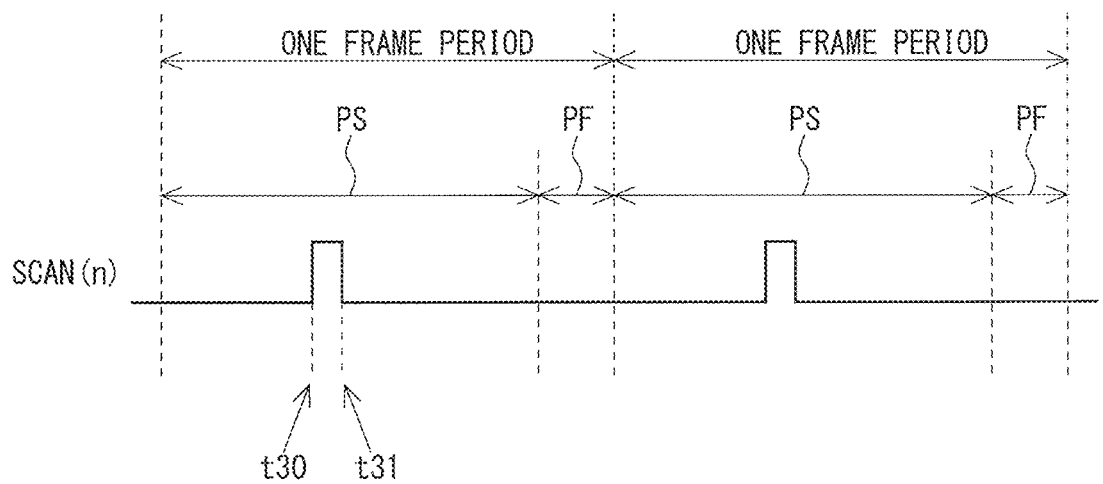
FIG. 17 is a timing chart for explaining the operation of the pixel circuit in the second embodiment.

FIG. 17 is a timing chart for explaining the operation of the pixel circuit 60. As illustrated in FIG. 17, each frame period includes a scanning period PS and a vertical retrace period PF. In the scanning period PS, the j scanning signal lines SCAN(1) to SCAN(j) are sequentially selected one by one. The vertical retrace period PF is a period provided to return a target of horizontal scanning from the scanning signal line SCAN(j) corresponding to the jth row to the scanning signal line SCAN(1) corresponding to the first row.

Hereinafter, attention is focused on the pixel circuit in the nth row. In a period prior to a time immediately before time t30, the scanning signal SCAN(n) is at the low level. In this period, the write control transistor T3 is in the off-state, and a drive current corresponding to the charge voltage of the holding capacitor Ca is being supplied to the organic EL element 61. Therefore, the organic EL element 61 is emitting light with luminance corresponding to the magnitude of the drive current.

At time t30, the scanning signal SCAN(n) changes from the low level to the high level. Thereby, the write control transistor T3 comes into the on-state, and the data signal D(m) is provided to the control node NG via the write control transistor T3. As a result, the holding capacitor Ca is charged.

At time t31, the scanning signal SCAN(n) changes from the high level to the low level. Thus, the write control transistor T3 comes into the off-state, and the charge voltage of the holding capacitor Ca (the gate-source voltage of the drive transistor T4) is determined. Then, a drive current corresponding to the charge voltage is supplied to the organic EL element 61. As a result, the organic EL element 61 emits light with luminance corresponding to the magnitude of the drive current. This state continues for a period until the scanning signal SCAN(n) next changes from the low level to the high level.

2.3 Control of Infrared Light (IR Light) Irradiation Timing

2.3.1 During Image Display

Figure 18:
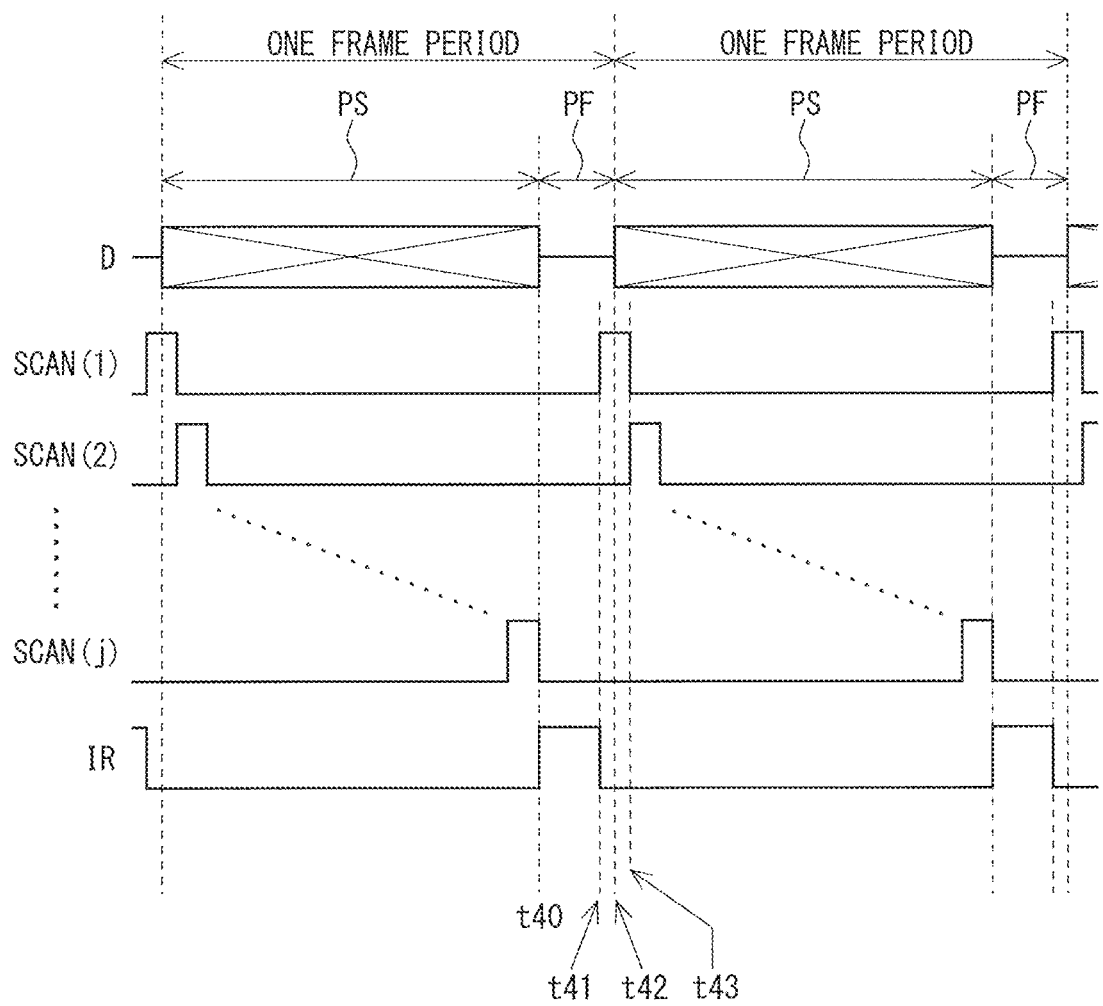
FIG. 18 is a timing chart for explaining an IR light irradiation timing in a period during which an image is displayed on a display unit in the second embodiment.

FIG. 18 is a timing chart for explaining an IR light irradiation timing in a period during which an image is displayed on the display unit 600. As described above, each frame period includes the scanning period PS and the vertical retrace period PF. In the scanning period PS, the data signal D is in a valid state as display data. Then, the scanning signals SCAN(1) to SCAN(j) are at the high level one by one for a predetermined period as illustrated in FIG. 18 such that data signals are written into all the pixel circuits 60 during the scanning period PS. In the vertical retrace period PF, a predetermined voltage (e.g., a voltage corresponding to white display, a voltage corresponding to black display, a ground voltage, etc.) is being applied to the data signal lines D.

Here, in FIG. 18, attention is focused on a period near the transition of the frame period. The period from time t40 to time t42 is a vertical retrace period PF of a preceding frame period. The scanning signal SCAN(j) changes from the high level to the low level at time t40. The scanning signal SCAN(1) changes from the low level to the high level at time t41 slightly before time t42 and changes from the high level to the low level at time t43 slightly after time t42. From the above, in the period from time t40 to time t41, all the scanning signals SCAN(1) to SCAN(j) are maintained at the low level. In the present embodiment, the IR light irradiation (the emission of the IR light from the emitting unit 72 of the proximity sensor 700) is performed during the period (period from time t40 to time t41). That is, the IR light irradiation is performed in a period before a time point at which the selection of the scanning signal lines SCAN included in the IR light irradiation region 601 is started among the vertical retrace period PF. In this manner, the IR light irradiation is performed during a period during which all the scanning signal lines SCAN(1) to SCAN(j) are maintained in the non-selected state.

As above, the emitting unit 72 of the proximity sensor 700 emits the IR light only in a period including at least a part of the vertical retrace period PF and before a time point at which the selection of the scanning signal lines SCAN connected to the pixel circuits 60 in the rows corresponding to the IR light irradiation region 601 is started. Here, in the present modification, the whole of the period during which the IR light is emitted from the emitting unit 72 is included in the vertical retrace period PF.

In the present embodiment, the emission starting step is achieved by the operation of the proximity sensor 700 at time t40 in FIG. 18, and the emission stopping step is achieved by the operation of the proximity sensor 700 at time t41 in FIG. 18.

2.3.2 During No Image Display

As in the first embodiment, also in the present embodiment, in a period during which no image is displayed on the display unit 600 (a period during which the power supply to the pixel circuits 60 is stopped), the IR light is emitted from the emitting unit 72 of the proximity sensor 700 at any timing. In other words, in a period during which no image is displayed, the emitting unit 72 of the proximity sensor 700 emits the IR light without synchronizing with the driving operation of the data signal lines D and the scanning signal lines SCAN.

2.4 Effects

According to the present embodiment, during the image display, the IR light irradiation is performed in a period before the start time point of the writing of the data signals into the pixel circuits 60 in the IR light irradiation region 601 in the vertical retrace period PF. When the IR light irradiation is performed at such a timing, even if the charge voltages of the holding capacitors Ca in the pixel circuits 60 included in the IR light irradiation region 601 fluctuate, the data signals are immediately written into the holding capacitors Ca, so that the influence of the increase in luminance due to the IR light irradiation can be reduced, and desired luminance display is performed. Further, the IR light irradiation is not performed during the writing of the data signals into the pixel circuits 60 in the IR light irradiation region 601, thereby preventing the occurrence of a phenomenon that desired gradation display is not performed throughout a period until the next writing of the data signals after the IR light irradiation. From the above, similarly to the first embodiment, in the organic EL display device provided with the proximity sensor, deterioration in display quality caused by the IR light irradiation is reduced as compared with the related art.

2.5 Modifications

2.5.1 First Modification

In the second embodiment, as illustrated in FIG. 18, the whole of the period during which the IR light irradiation is performed is included in the retrace period PF described above. However, it is not limited to this, and the IR light irradiation may be started from a time point before the start time point of the retrace period PF so long as visibility is not greatly affected.

2.5.2 Second Modification

Figure 19:
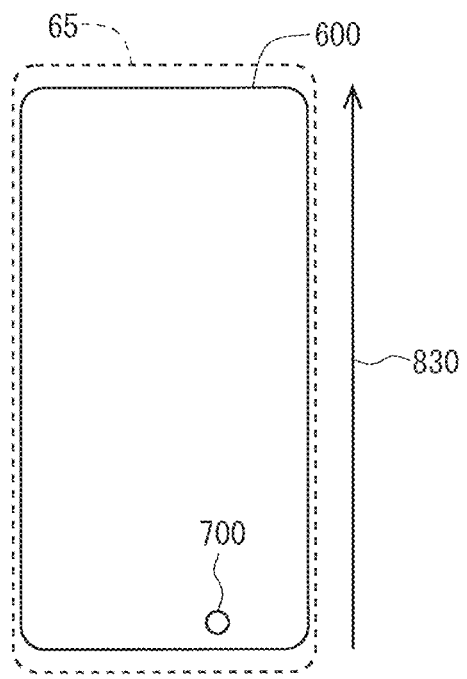
FIG. 19 is a diagram for explaining a selection order of scanning signal lines in a second modification of the second embodiment.
Figure 20:
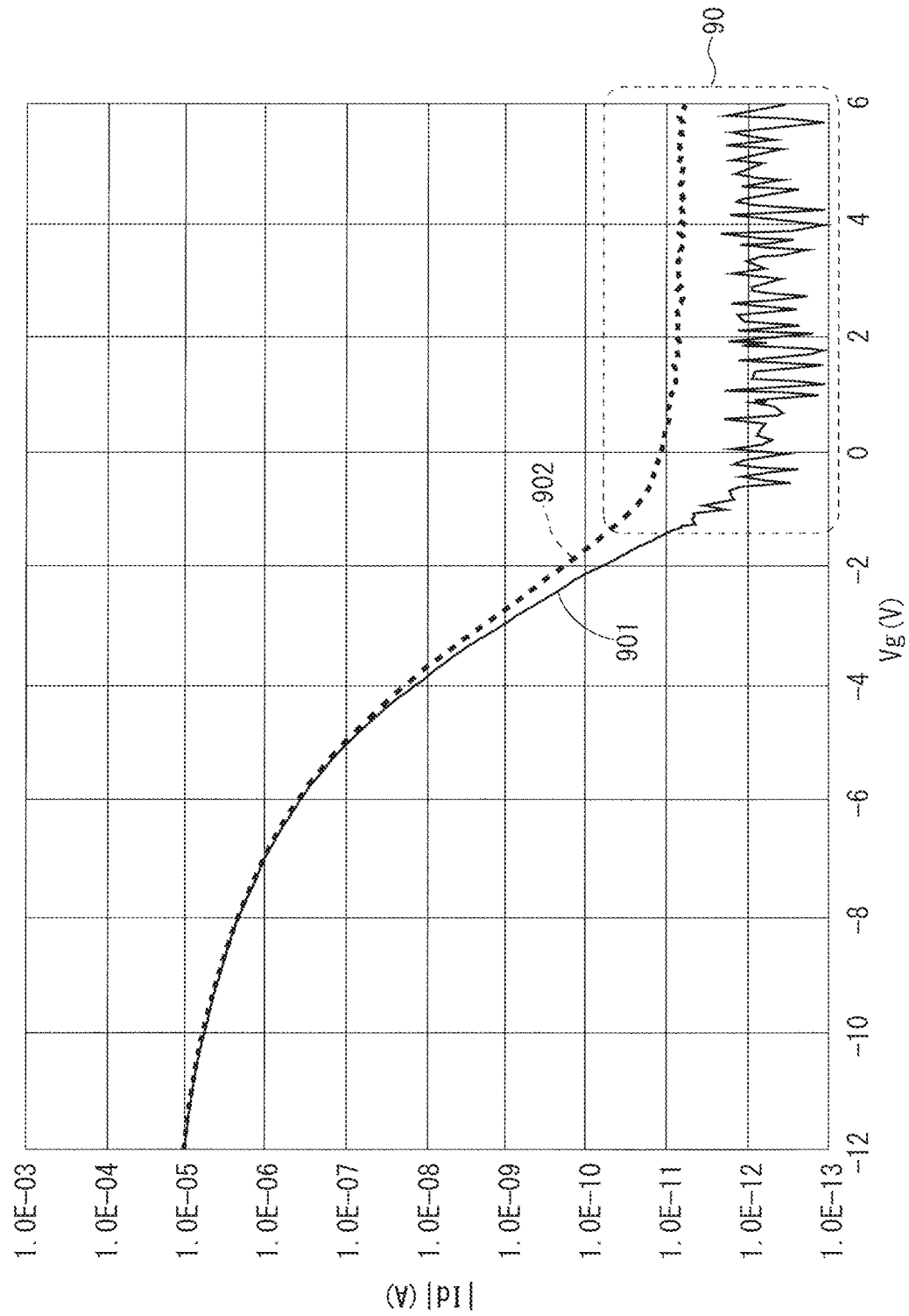
FIG. 20 is a diagram for explaining an example of a change in a current-voltage characteristic when a thin-film transistor is irradiated with IR light.
Figure 21:
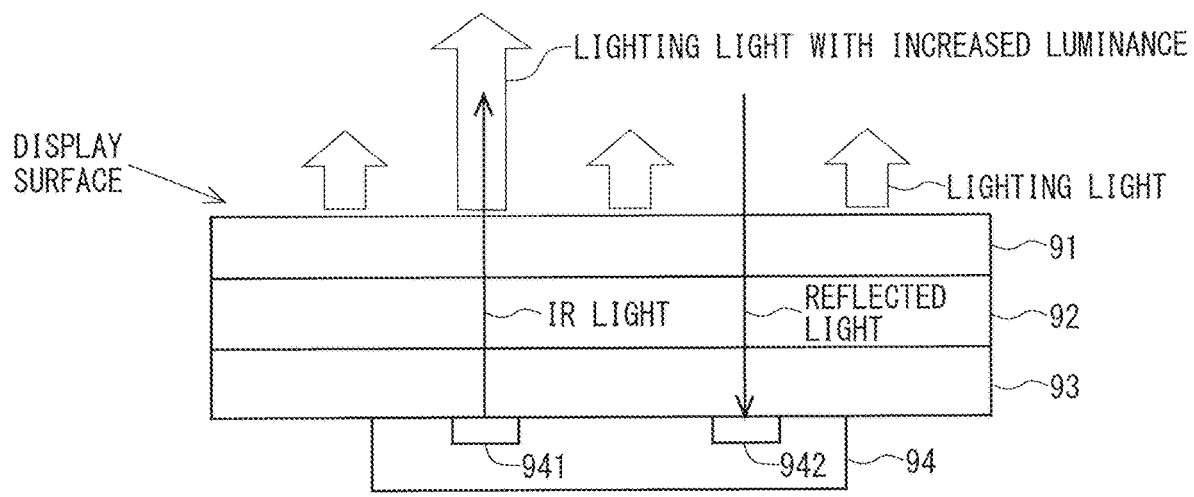
FIG. 21 is a schematic diagram for explaining an increase in luminance of a pixel.
Figure 22:
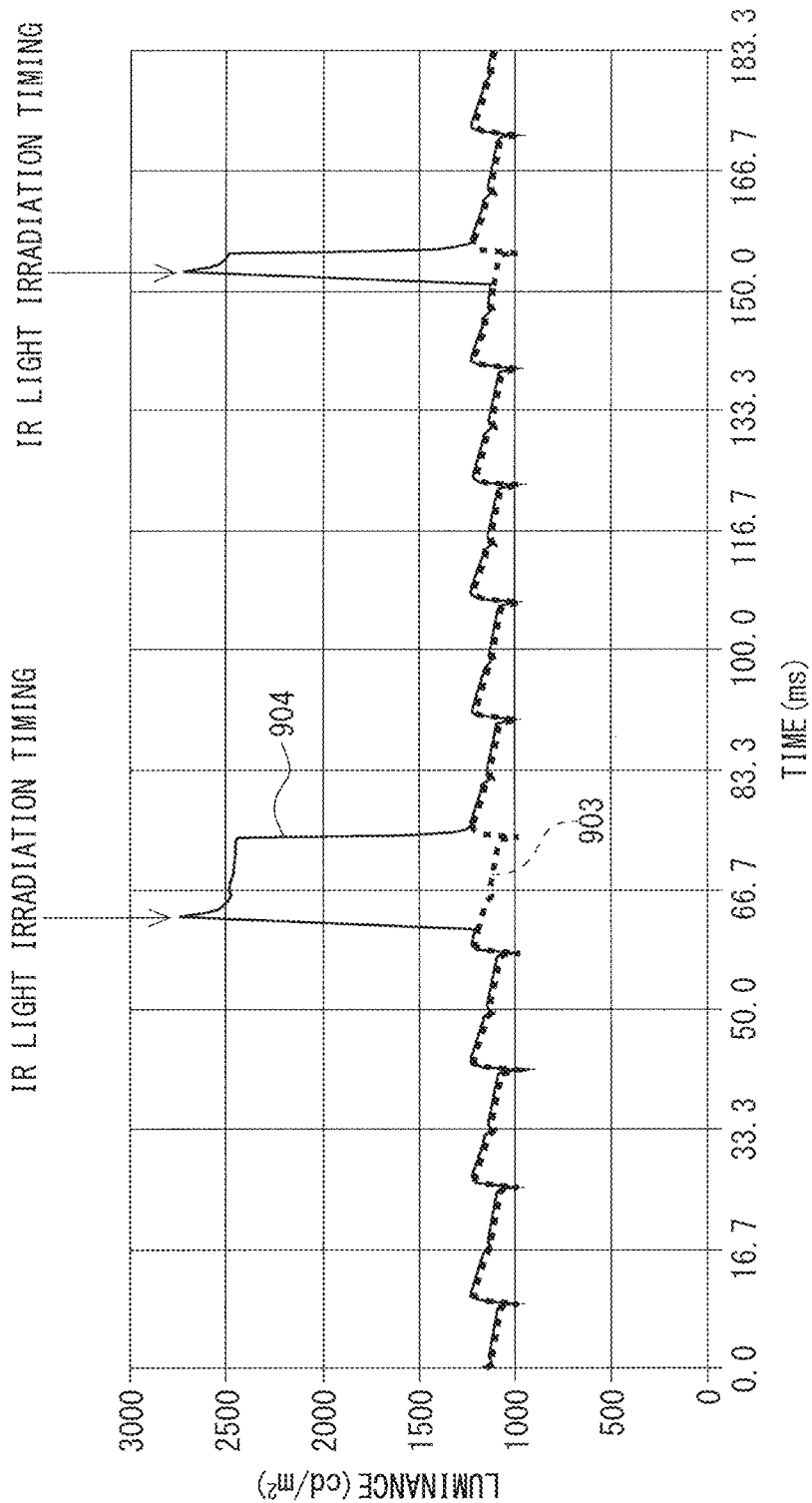
FIG. 22 is a diagram for explaining the influence of the IR light irradiation on display luminance.
Figure 23:
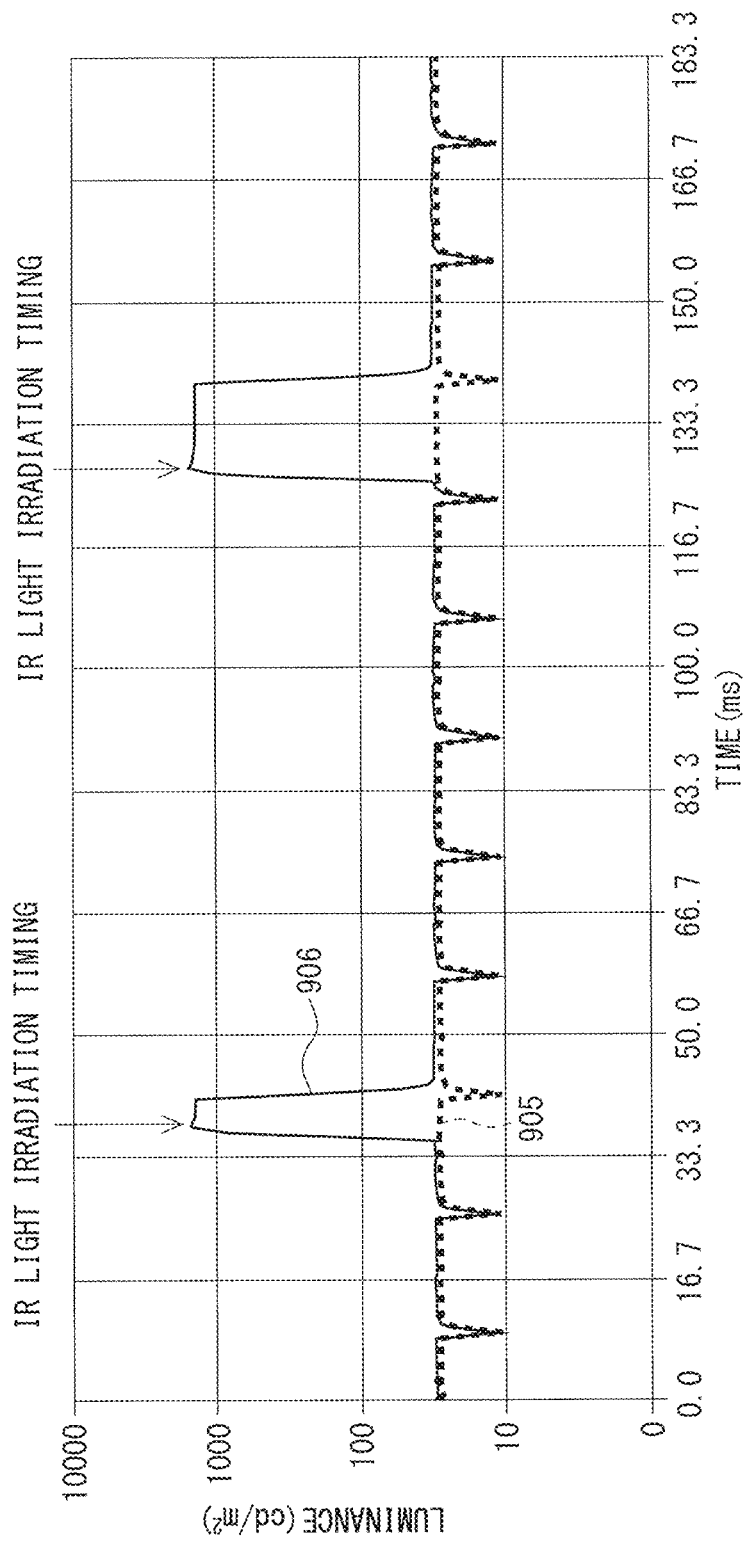
FIG. 23 is a diagram for explaining the influence of the IR light irradiation on display luminance.

In the second embodiment, the proximity sensor 700 is provided at a position near the upper end of the display unit 600 as viewed from a viewer (cf. FIG. 3). However, it is not limited to this, and the present disclosure can also be applied to a case where the proximity sensor 700 is provided at a position near the lower end of the display unit 600 as viewed from the viewer as illustrated in FIG. 19. However, in this case, the j scanning signal lines SCAN(1) to SCAN(j) in the display unit 600 are brought into a selected state one by one in a direction of an arrow denoted by reference numeral 830 in FIG. 19. Under the above premise, in the present modification as well, it is preferable that the IR light irradiation be performed in a period before the start time point of the writing of the data signals into the pixel circuits 60 in the IR light irradiation region 601 in the vertical retrace period PF.

From the second embodiment and the present modification, regardless of the position where the proximity sensor 700 is provided, it is preferable that the IR light irradiation be performed in a period before the start time point of the writing of the data signals in the vertical retrace period PF and that the writing of the data signals in the scanning period PS be started from the pixel circuits in the row corresponding to the IR light irradiation region 601.

3. Others

Although the organic EL display device has been described as an example in each of the above embodiments and modifications, it is not limited to this. The present disclosure can also be applied to an inorganic EL display device, a quantum dot light-emitting diode (QLED) display device, and the like so long as the display device includes a proximity sensor and adopts a display element driven by a current.

DESCRIPTION OF REFERENCE CHARACTERS

6: ORGANIC EL PANEL
60: PIXEL CIRCUIT
61: ORGANIC EL ELEMENT
72: emitting unit (OF PROXIMITY SENSOR)
74: LIGHT RECEIVING UNIT (OF PROXIMITY SENSOR)
300: SOURCE DRIVER (DATA SIGNAL LINE DRIVE CIRCUIT)
400: GATE DRIVER (SCANNING SIGNAL LINE DRIVE CIRCUIT)
500: EMISSION DRIVER (LIGHT-EMISSION CONTROL LINE DRIVE CIRCUIT)
600: DISPLAY UNIT
601: IR LIGHT IRRADIATION REGION
700: PROXIMITY SENSOR
D (1) to D (i): DATA SIGNAL LINE, DATA SIGNAL
EM (1) to EM (j): LIGHT-EMISSION CONTROL LINE, LIGHT-EMISSION CONTROL SIGNAL
SCAN (1) to SCAN (j): SCANNING SIGNAL LINE, SCANNING SIGNAL
NG: CONTROL NODE
T1: FIRST INITIALIZATION TRANSISTOR
T2: THRESHOLD VOLTAGE COMPENSATION TRANSISTOR
T3: WRITE CONTROL TRANSISTOR
T4: DRIVE TRANSISTOR
T5: POWER SUPPLY CONTROL TRANSISTOR
T6: LIGHT-EMISSION CONTROL TRANSISTOR
T7: SECOND INITIALIZATION TRANSISTOR

The invention claimed is:
1. A display device provided with a pixel circuit including a display element driven by a current, the display device comprising:
a display unit that includes a plurality of the pixel circuits of a plurality of rows and a plurality of columns,
a plurality of data signal lines configured to supply data signals to a plurality of the pixel circuits in corresponding respective columns,
a plurality of scanning signal lines configured to control writing of the data signals into a plurality of the pixel circuits in corresponding respective rows, and
a plurality of light-emission control lines configured to control whether to supply a current to the display element included in each of a plurality of the pixel circuits in the corresponding respective rows; and
a proximity sensor that includes
an emitting unit configured to emit infrared light from a back surface of the display unit, and
a light receiving unit configured to receive reflected light of the infrared light, wherein
in a display period during which an image is displayed on the display unit, the emitting unit emits the infrared light only in a period including a part of an infrared light irradiation region turn-off period during which the plurality of light-emission control lines are driven such that no current is supplied to the display element included in each of a plurality of the pixel circuits in each of rows corresponding to an infrared light irradiation region that is irradiated with the infrared light, the period being before a time point at which writing of the data signals into a plurality of the pixel circuits in each of rows corresponding to the infrared light irradiation region is started.

2. The display device according to claim 1, wherein the plurality of light-emission control lines are driven such that a period during which a state where no current is supplied to the display element included in each pixel circuit is maintained is longer than a period during which the plurality of scanning signal lines are driven so as to cause the data signals to be written into all of a plurality of the pixel circuits in the infrared light irradiation region row by row.

3. The display device according to claim 1, wherein the plurality of light-emission control lines are driven such that a period during which a state where no current is supplied to the display element included in each pixel circuit is maintained is longer than a sum of a period during which the plurality of scanning signal lines are driven so as to cause the data signals to be written into all of a plurality of the pixel circuits in the infrared light irradiation region row by row and a period during which the infrared light is emitted from the emitting unit.

4. The display device according to claim 1, wherein a whole of a period during which the infrared light is emitted from the emitting unit is included in the infrared light irradiation region turn-off period.

5. The display device according to claim 1, wherein
the plurality of light-emission control lines are respectively connected to a plurality of the pixel circuits in rows of a number equal to a number of rows corresponding to the infrared light irradiation region, and
all of a plurality of the pixel circuits in the infrared light irradiation region are connected to a same light-emission control line.

6. The display device according to claim 1, wherein in a non-display period during which no image is displayed on the display unit, the emitting unit emits the infrared light without synchronizing with driving operations of the plurality of data signal lines, the plurality of scanning signal lines, and the plurality of light-emission control lines.

7. The display device according to claim 1, further comprising:
a first power line configured to supply a high-level power supply voltage;
a second power line configured to supply a low-level power supply voltage; and
an initialization power line configured to supply an initialization voltage, wherein
each pixel circuit includes
a control node,
the display element including a first terminal and a second terminal connected to the second power line,
a drive transistor having a control terminal connected to the control node, a first conduction terminal, and a second conduction terminal,
a holding capacitor having one end connected to the first power line and the other end connected to the control node,
a first initialization transistor having a control terminal connected to one of the plurality of scanning signal lines, a first conduction terminal connected to the control node, and a second conduction terminal connected to the initialization power line,
a write control transistor having a control terminal connected to one of the plurality of scanning signal lines, a first conduction terminal connected to one of the plurality of data signal lines, and a second conduction terminal connected to the first conduction terminal of the drive transistor,
a threshold voltage compensation transistor having a control terminal connected to one of the plurality of scanning signal lines, a first conduction terminal connected to the second conduction terminal of the drive transistor, and a second conduction terminal connected to the control node,
a power supply control transistor having a control terminal connected to one of the plurality of light-emission control lines, a first conduction terminal connected to the first power line, and a second conduction terminal connected to the first conduction terminal of the drive transistor, and
a light-emission control transistor having a control terminal connected to one of the plurality of light-emission control lines, a first conduction terminal connected to the second conduction terminal of the drive transistor, and a second conduction terminal connected to the first terminal of the display element.

8. The display device according to claim 7, wherein the first initialization transistor and the threshold voltage compensation transistor have a dual-gate structure.

9. The display device according to claim 7, wherein each pixel circuit includes a second initialization transistor having a control terminal connected to one of the plurality of scanning signal lines, a first conduction terminal connected to the first terminal of the display element, and a second conduction terminal connected to the initialization power line.

10. The display device according to claim 1, further comprising:
a first power line configured to supply a high-level power supply voltage; and
a second power line configured to supply a low-level power supply voltage, wherein
each pixel circuit includes
a control node,
the display element having a first terminal and a second terminal connected to the second power line, a drive transistor having a control terminal connected to the control node, a first conduction terminal connected to the first power line, and a second conduction terminal, a write control transistor having a control terminal connected to one of the plurality of scanning signal lines, a first conduction terminal connected to one of the plurality of data signal lines, and a second conduction terminal connected to the control node, a light-emission control transistor having a control terminal connected to one of the plurality of light-emission control lines, a first conduction terminal connected to the second conduction terminal of the drive transistor, and a second conduction terminal connected to the first terminal of the display element, and a holding capacitor having one end connected to the control node and the other end connected to the second conduction terminal of the drive transistor.

11. A display device provided with a pixel circuit including a display element driven by a current, the display device comprising:

a display unit that includes a plurality of the pixel circuits of a plurality of rows and a plurality of columns, a plurality of data signal lines configured to supply data signals to a plurality of the pixel circuits in corresponding respective columns, and a plurality of scanning signal lines configured to control writing of the data signals into a plurality of the pixel circuits in corresponding respective rows; and a proximity sensor that includes an emitting unit configured to emit infrared light from a back surface of the display unit, and a light receiving unit configured to receive reflected light of the infrared light, wherein in a display period during which an image is displayed on the display unit, the emitting unit emits the infrared light only in a period including at least a part of a vertical retrace period, the period being before a time point at which selection of scanning signal lines each connected to a plurality of the pixel circuits in each of rows corresponding to an infrared light irradiation region that is irradiated with the infrared light is started.

12. The display device according to claim 11, wherein a whole of a period during which the infrared light is emitted from the emitting unit is included in the vertical retrace period.

13. The display device according to claim 11, wherein the proximity sensor is provided, on a back surface of the display unit, on one end side in a direction in which the plurality of data signal lines extend, and the plurality of scanning signal lines are driven such that writing of the data signals into the plurality of the pixel circuits of the plurality of rows and the plurality of columns is sequentially performed row by row from a side where the proximity sensor is provided.

14. The display device according to claim 11, wherein in a non-display period during which no image is displayed on the display unit, the emitting unit emits the infrared light without synchronizing with driving operations of the plurality of data signal lines and the plurality of scanning signal lines.

15. The display device according to claim 11, further comprising:

a first power line configured to supply a high-level power supply voltage; and a second power line configured to supply a low-level power supply voltage, wherein each pixel circuit includes a control node, the display element having a first terminal and a second terminal connected to the second power line, a drive transistor having a control terminal connected to the control node, a first conduction terminal connected to the first power line, and a second conduction terminal connected to the first terminal of the display element, a write control transistor having a control terminal connected to one of the plurality of scanning signal lines, a first conduction terminal connected to one of the plurality of data signal lines, and a second conduction terminal connected to the control node, and a holding capacitor having one end connected to the control node and the other end connected to the second conduction terminal of the drive transistor.

16. A control method for a proximity sensor mounted on a display device, the display device including a display unit that includes a plurality of pixel circuits of a plurality of rows and a plurality of columns, each of the plurality of pixel circuits including a display element driven by a current, a plurality of data signal lines configured to supply data signals to a plurality of pixel circuits in corresponding respective columns, a plurality of scanning signal lines configured to control writing of the data signals into a plurality of pixel circuits in corresponding respective rows, and a plurality of light-emission control lines configured to control whether to supply a current to the display element included in each of a plurality of pixel circuits in the corresponding respective rows, the proximity sensor including an emitting unit configured to emit infrared light from a back surface of the display unit, and a light receiving unit configured to receive reflected light of the infrared light, the control method comprising:

an emission starting step of starting emission of the infrared light from the emitting unit; and an emission stopping step of stopping the emission of the infrared light from the emitting unit, wherein in a display period during which an image is displayed on the display unit, the emission starting step and the emission stopping step are performed in such a manner that the infrared light is emitted from the emitting unit only in a period including a part of an infrared light irradiation region turn-off period during which the plurality of light-emission control lines are driven such that no current is supplied to the display element included in each of a plurality of the pixel circuits in each of rows corresponding to an infrared light irradiation region that is irradiated with the infrared light, the period being before a time point at which writing of the data signals into a plurality of pixel circuits in each of rows corresponding to the infrared light irradiation region is started.

* * * * *